(12) United States Patent
Atwell et al.

(10) Patent No.: US 6,477,104 B1
(45) Date of Patent: Nov. 5, 2002

(54) TILED MEMORY AND MEMORY TILE FOR USE THEREIN

(75) Inventors: William Daune Atwell, Spicewood; Michael L. Longwell, Austin; Jeffrey Van Myers, Driftwood, all of TX (US)

(73) Assignees: Madrone Solutions, Inc., Austin, TX (US); Motorola Inc., Schaumburg, IL (US)

( * ) Notice: Subject to any disclaimer, the term of this patent is extended or adjusted under 35 U.S.C. 154(b) by 0 days.

(21) Appl. No.: 09/286,178

(22) Filed: Apr. 5, 1999

(51) Int. Cl.[7] .............................. G11C 7/00; G11C 29/00
(52) U.S. Cl. ....................................... 365/226; 365/200
(58) Field of Search .............................. 365/200, 203, 365/226, 230.03, 189.09

(56) References Cited

U.S. PATENT DOCUMENTS 6,154,413 A * 11/2000 Longwell et al. ...... 365/230.03
6,167,484 A * 12/2000 Boyer et al. ................. 365/222
6,249,475 B1 * 6/2001 Atwell et al. .......... 365/230.03
6,272,670 B1 * 8/2001 Van Myers et al. ......... 365/226

* cited by examiner

Primary Examiner—Trong Phan
(74) Attorney, Agent, or Firm—J.V. Myers & Associates, P.C.

(57) ABSTRACT

A plurality of memory tiles (22) are arranged to form a tiled memory array (12) in an integrated circuit device (400). In accordance with the present invention, each of the memory tiles (22) in the tiled memory array (12) has charge source circuitry (24) to provided the sufficient reference voltages for proper operation of the memory tile (22). In addition, each memory tile (22) may include local error detection and correction circuitry (36b). To facilitate reliable operation, each memory tile may also include redundant rows and/or columns, and appropriate redundancy control circuitry (32c', 32c41 ).

247 Claims, 20 Drawing Sheets

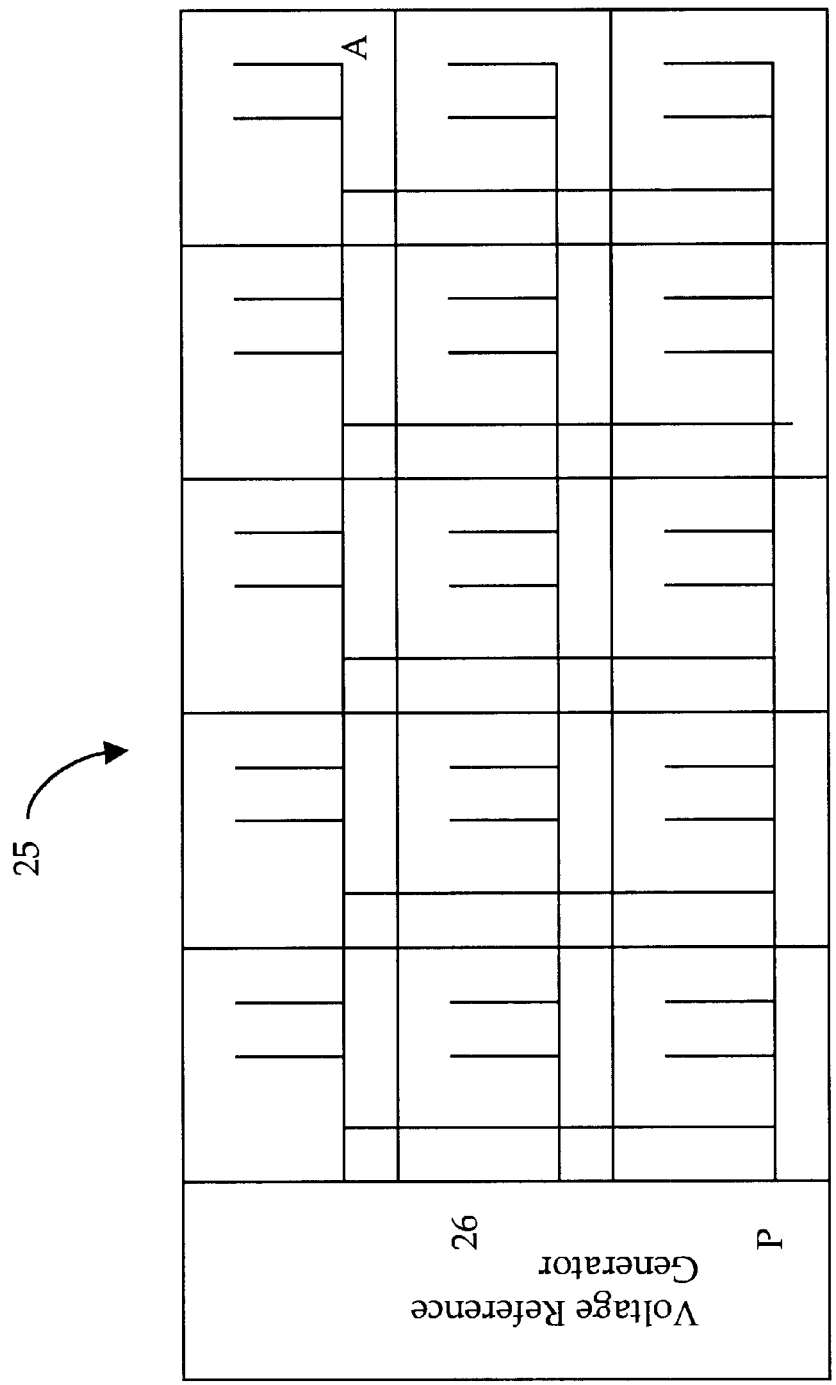
FIG. 2a —Prior Art—

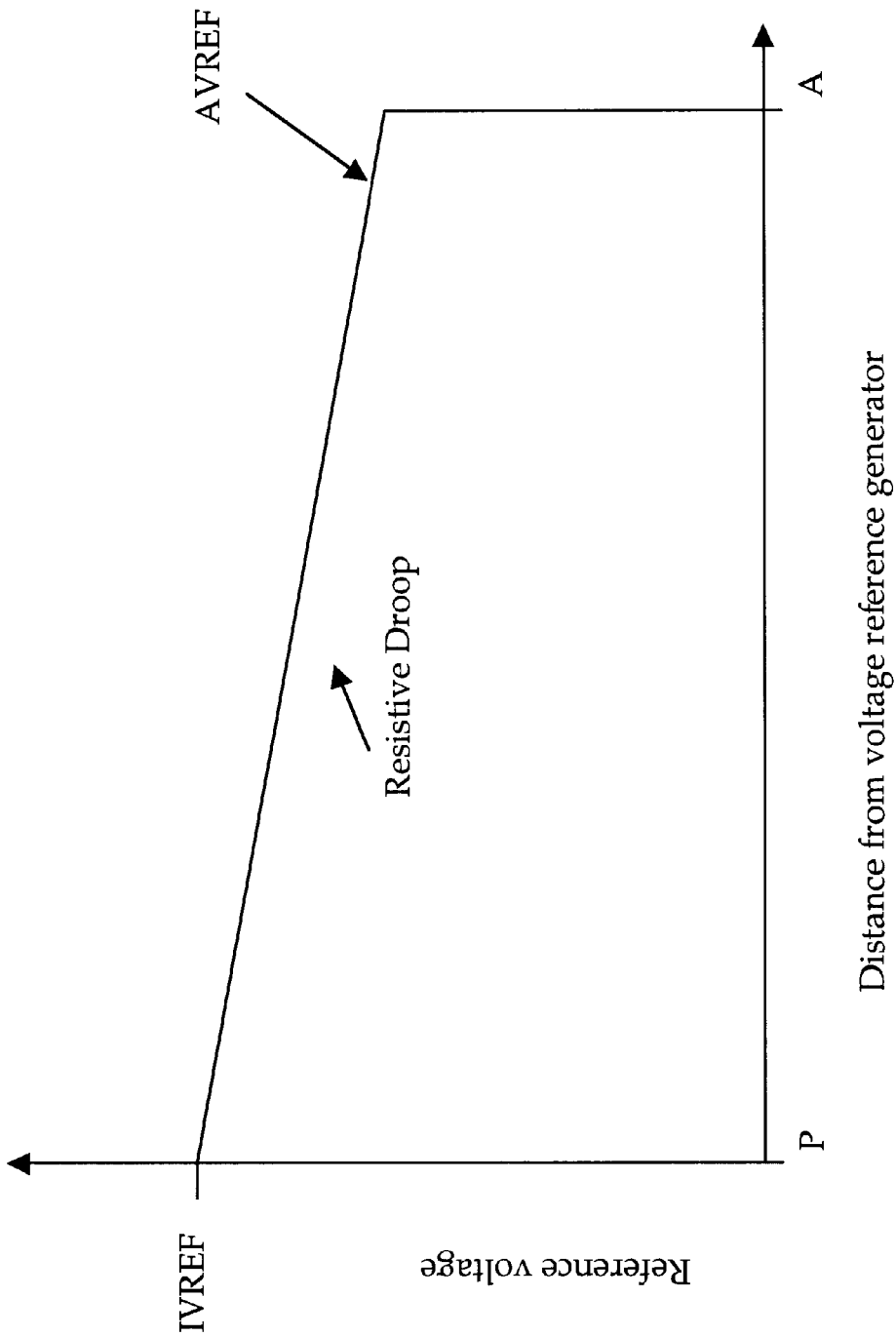
FIG. 2b --Prior Art--

TILED MEMORY AND MEMORY TILE FOR USE THEREIN

REFERENCE TO CO-PENDING APPLICATIONS

The present invention is related to the following co-pending applications for patents:

"MEMORY TILE FOR USE IN A TILED MEMORY" by Michael L. Longwell, et al., Application Ser. No. 09/286,196, filed concurrently herewith and assigned jointly and severally to Madrone Solutions, Inc., and Motorola, Inc.;

"METHOD FOR DESIGNING A TILED MEMORY" by William Daune Atwell, et al., U.S. Pat. No. 6,249,475 B1, assigned jointly and severally to Madrone Solutions, Inc., and Motorola, Inc.;

"METHOD FOR DESIGNING A MEMORY TILE FOR USE IN A TILED MEMORY" by Michael L. Longwell, et al., U.S. Pat. No. 6,154,413, assigned jointly and severally to Madrone Solutions, Inc., and Motorola, Inc.; and "DISTRIBUTED CHARGE SOURCE" by Jeffrey Van Myers, et al., U.S. Pat. No. 6,272,670 B1, assigned to Madrone Solutions, Inc.

FIELD OF THE INVENTION

The present invention relates to integrated circuits, and more specifically to integrated circuit memories.

BACKGROUND OF THE INVENTION

With each new generation of semiconductor memory, the size and density of the memory array increases. For example, when moving from a 4 Mb technology to a 16 Mb design, the array area must be increased in order to accommodate the additional memory cells. Increasing the array size, however, adversely effects certain electrical parameters required for optimal circuit performance.

In particular, increasing the size of the memory array leads to a problem known as "resistance droop". In the memory array, long interconnect wires are used to carry voltages across the memory array. When a voltage source is connected to a long interconnect wire, a voltage drop is created on the interconnect wire due to the resistance of the interconnect wire. More specifically, points on the interconnect wire which are located far from the voltage source have a lower voltage potential than those which are located near the voltage source. This voltage differential in the memory array can adversely effect circuit performance and circuit yield.

Accordingly, a need exists for an efficient way to fabricate integrated circuits having memory arrays with reduced "resistance droop."

SUMMARY OF THE INVENTION

The present invention overcomes the problems of the prior art memory circuits by providing a tiled memory with distributed charge source supply. According to one embodiment of the present invention, a plurality of memory tiles are arranged to form a tiled memory array with a common input/output interface in an integrated circuit device. In accordance with the present invention, each of the memory tiles in the tiled memory array has charge source circuitry to provide the sufficient reference voltages for proper operation of the memory tile. Further, the reference voltage for each tile is connected by abutment to the reference voltages associated with neighboring tiles. In addition, each memory tile may include local error detection and correction circuitry. To facilitate reliable operation, each memory tile may also include redundant rows and/or columns, and appropriate redundancy control circuitry.

In one aspect of the present invention, a tiled memory includes a plurality of memory tiles, each memory tile comprising a plurality of memory cells and a charge source and an interface for selectively coupling the memory tiles to external logic.

BRIEF DESCRIPTION OF THE DRAWINGS

The present invention may be more fully understood by a description of certain preferred embodiments in conjunction with the attached drawings in which:

FIG. 2a illustrates a portion of a prior art memory array;

FIG. 2b is a plot of reference voltage as a function of physical location in the prior art memory array of FIG. 2a;

FIG. 3b is a plot of reference voltage as a function of physical location in the tiled memory array of FIG. 3a;

DETAILED DESCRIPTION OF THE PREFERRED EMBODIMENTS

The present invention provides a memory tile having its own charge source circuitry. In one embodiment, a plurality of the memory tiles are combined to form a tiled memory array in a stand alone memory device. In an alternative embodiment, a plurality of memory tiles are combined to form a tiled memory array in an integrated circuit having an embedded memory.

Figure 1:
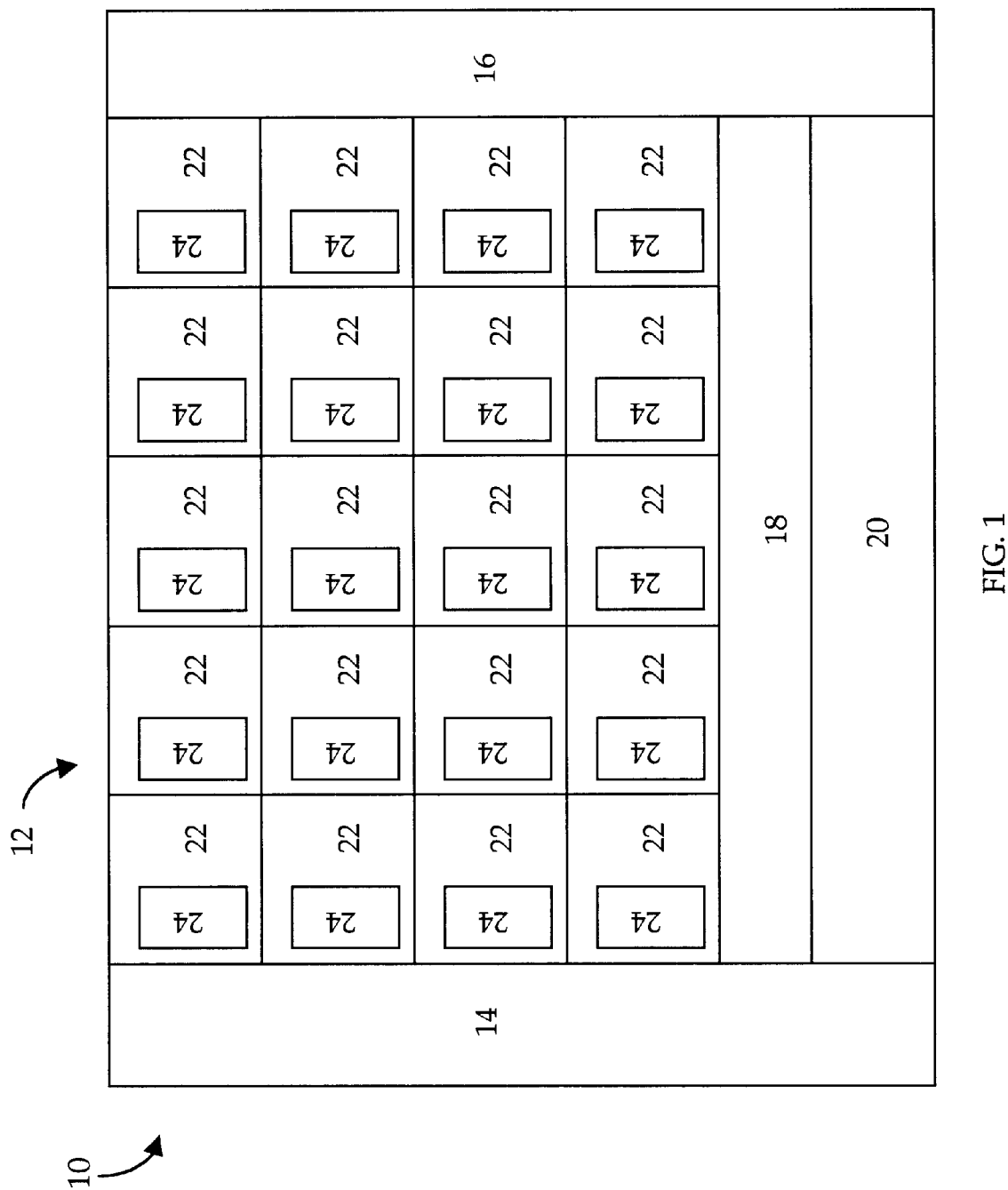
FIG. 1 illustrates in block diagram form a tiled memory device designed in accordance with one embodiment of the present invention.

FIG. 1 illustrates, in block diagram form, a tiled memory device 10 that is in accordance with one embodiment of the present invention. In this particular embodiment, tiled memory device 10 includes a tiled memory array 12, fuse circuitry 14, error detection and correction circuitry 16, test circuitry 18, and memory interface circuitry 20.

Fuse circuitry 14 is coupled to tiled memory array 12 and is used to repair defects within tiled memory array 12. Error detection and correction circuitry 16 is coupled to tiled memory array 12 and detects and corrects errors within tiled memory array 12. Note, error detection and correction circuitry 16 may be used to correct soft or hard errors. Test circuitry 18 is coupled to tiled memory array 12 and is used to test tiled memory array 12. In one embodiment, test circuitry 18 is built-in self-test (BIST) circuitry. In an alternative embodiment, test circuitry is built-in self-repair (BISR) circuitry. In another embodiment, test circuitry 18 includes both BIST circuitry and BISR circuitry. Memory interface circuitry 20 is coupled to tiled memory array 12 and contains circuitry which allows tiled memory array 12 to interface with logic circuitry external to tiled memory device 10. More specifically, memory interface circuitry 20 contains circuitry which allows tiled memory array 12 to interface with different external logic architectures. For example, if tiled memory array 12 is to interface with an advanced RISC microprocessor, referred to as an ARM microprocessor, then memory interface circuitry 20 includes circuitry which allows the memory tiles 22 within tiled memory array 12 to be selectively coupled to the ARM microprocessor. In one embodiment, memory interface circuitry 20 includes a DRAM controller. In an alternative embodiment memory interface circuitry 20 includes refresh control circuitry which allows tiled memory array 12 to interface with external logic. In another embodiment memory interface circuitry 20 includes circuitry which controls the power consumption of tiled memory array 12, and thus allows tiled memory array 12 to interface with external logic. Note, tiled memory array 12 includes a plurality of memory tiles 22, and each memory tile 22 contains a plurality of memory cells and its own charge source circuitry 24.

Shown in FIG. 2a, is a portion of a prior art memory array 25. Note that in the prior art a single voltage reference generator 26 supplies the entire memory array 25 with a reference voltage, as shown in FIG. 2a. A point "P" is provided as a locational reference within the voltage reference generator 26 and a point "A" is provided as a locational reference within the memory array 25. Points P and A will be used to illustrate degradation of the source voltage as a function of distance from the source, as illustrated in FIG. 2b.

Shown in FIG. 2b, is a plot of reference voltage as a function of location for the prior art memory array of FIG. 2a. The horizontal axis represents physical distance from point P to point A within the memory array 25 of FIG. 2a. The vertical axis represents reference voltage. An intended reference voltage, or design reference voltage is indicated on the vertical axis as IVREF. The actual reference voltage (AVREF), as measured within the memory array 25, is plotted as a function of distance from the voltage reference generator. Note that at point P the actual reference voltage (AVREF) is equal to the intended reference voltage (IVREF) as expected. However, at point A within the memory array AVREF is less than IVREF. This voltage differential is known as a "resistive droop," and is due to interconnect resistance. As the distance between the voltage reference generator and a specific location in the memory array increases, interconnect resistance between the two points increases, and this results in the two points having different voltages, as shown in FIG. 2b (i.e. degradation of AVREF).

Figure 3A:
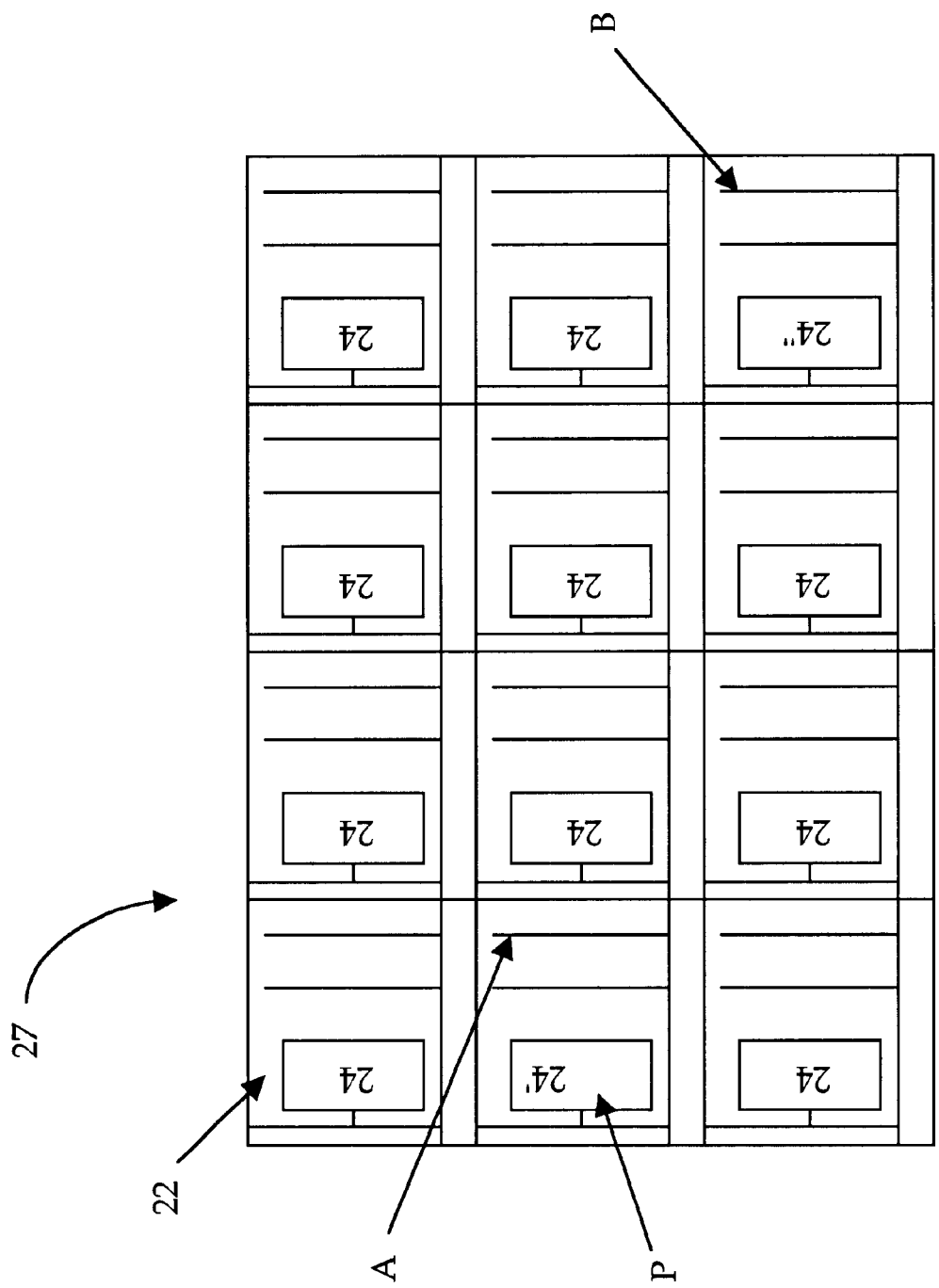
FIG. 3a illustrates a portion of a tiled memory array designed in accordance with one embodiment of the present invention.

Shown in FIG. 3a, is a portion 27 of tiled memory array 12, in accordance with one embodiment of the present invention. As previously described, each memory tile 22 within tiled memory array 12 contains its own charge source circuitry 24. A point "P" is provided as a locational reference within the charge source circuitry 24'. Points "A" and "B" are provided as locational references within the portion 27. Points P, A and B will be used to illustrate degradation of the source voltage as a function of distance from the source, as illustrated in FIG. 3b.

Figure 3B:
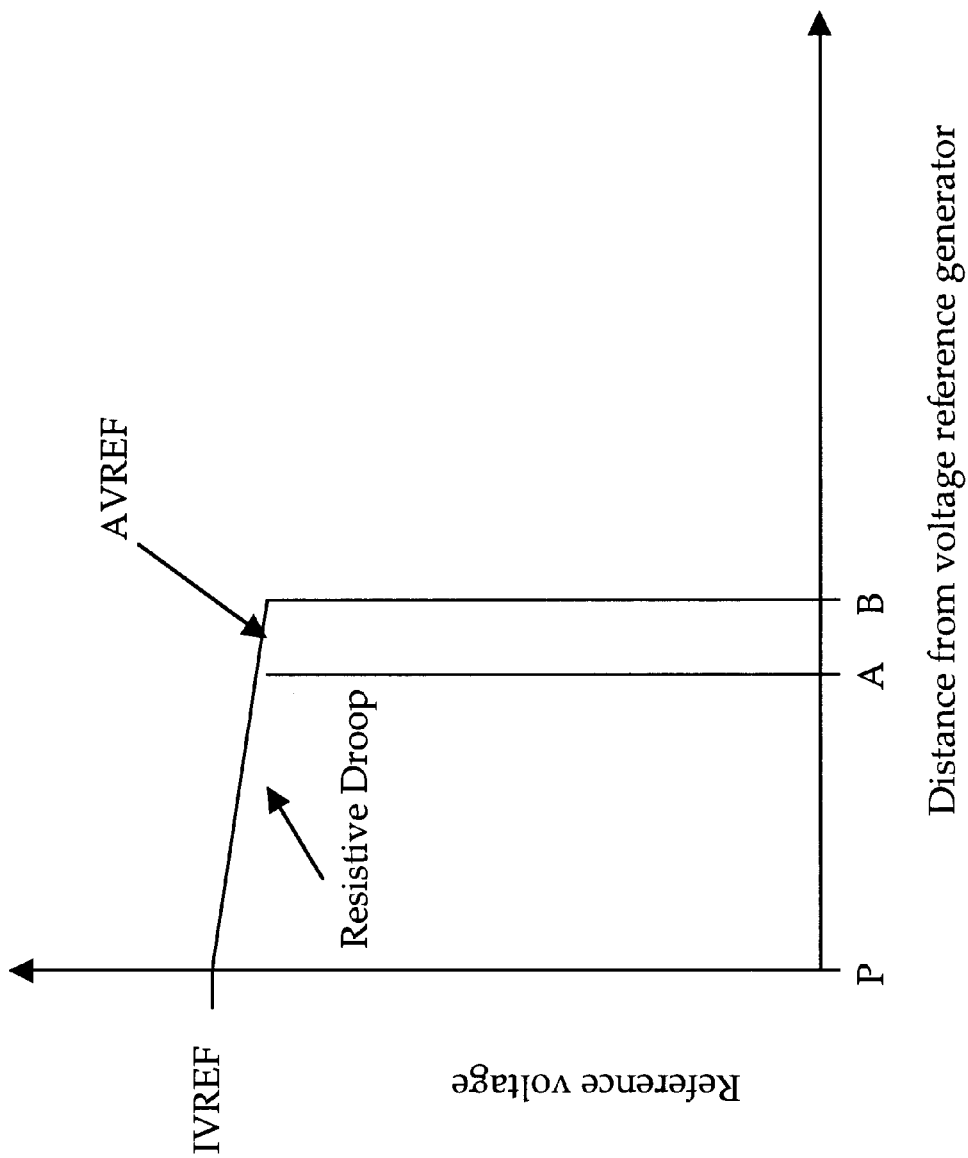

Shown in FIG. 3b, is a plot of reference voltage as a function of location for portion 27 of FIG. 3a. The horizontal axis represents physical distance from point P to points A and B within the portion 27 of FIG. 3a. The vertical axis represents reference voltage. As in FIG. 2b, an intended reference voltage, or design reference voltage is indicated on the vertical axis as IVREF. The actual reference voltage (AVREF), as measured within the portion 27, is plotted as a function of distance from the voltage reference generator. Note that at point P the actual reference voltage (AVREF) is equal to the intended reference voltage (IVREF) as expected. Moreover, at point A within the memory array AVREF is still nearly equal to IVREF. This occurs because the distance between point A and charge source circuitry 24' is small, and thus the resistance between these two points is also small. Furthermore, at point B within the memory array AVREF is still nearly equal to IVREF. This occurs because charge source circuitry 24" is primarily responsible for supplying point B with a reference voltage, not charge source circuitry 24'. Thus, we have found that "resistive droop" within tiled memory array 12 is minimized because each memory tile 22 contains its own charge source circuitry 24.

It should also be appreciated that a further advantage of the present invention is that the charge source circuitry of each memory tile in the tiled memory array can be connected together. Therefore, if the charge source circuitry within a particular memory tile does not function properly, it can be compensated for by the charge source circuitry of the surrounding memory tiles in the tiled memory array. In this way, if charge source circuitry 24' is defective, charge may be sourced from the multiple surrounding charge source circuitry 24.

Figure 4:
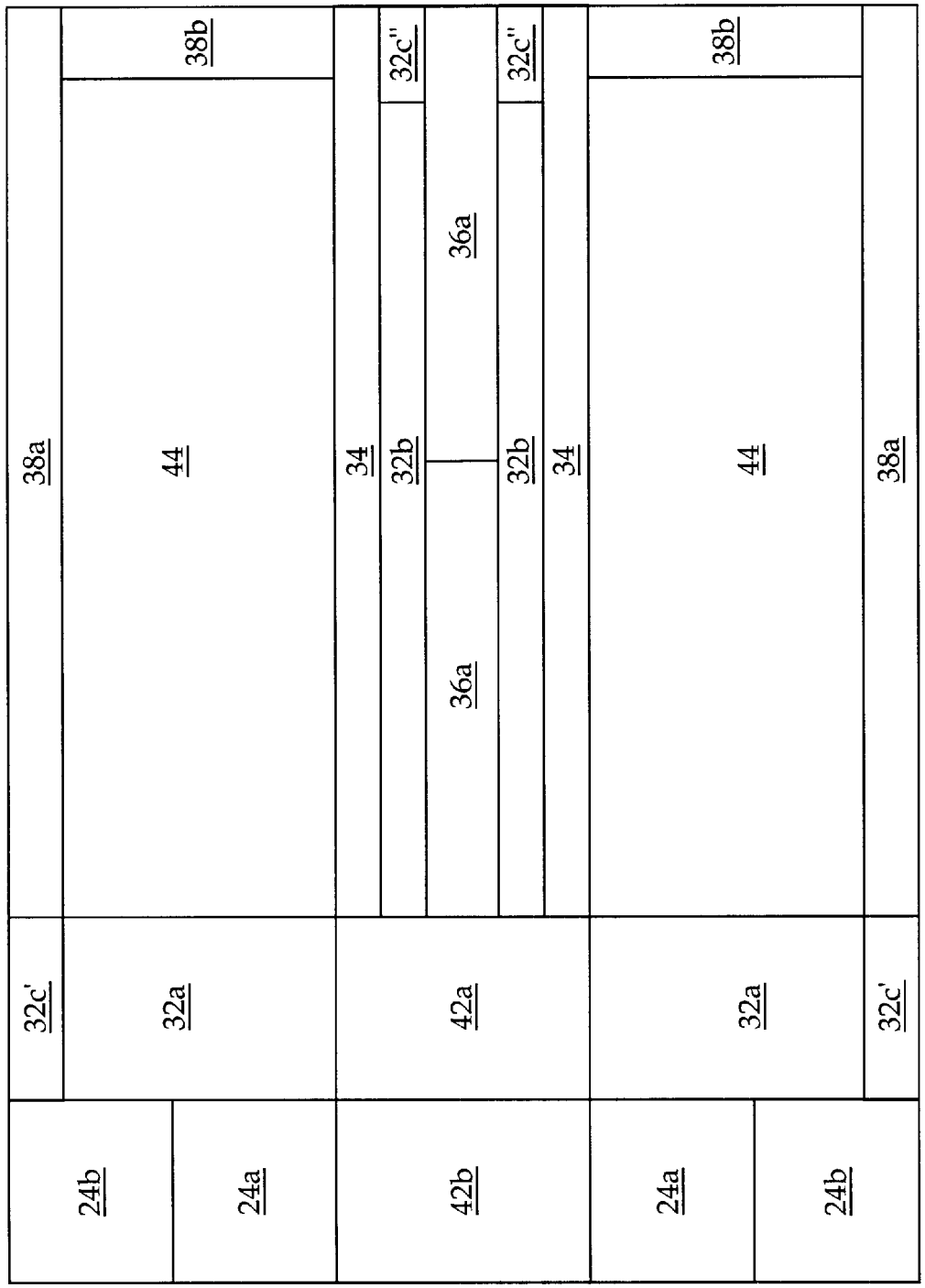
FIG. 4 illustrates in block diagram form a memory tile designed in accordance with one embodiment of the present invention.

FIG. 4 illustrates in block diagram form memory tile 22 of FIG. 1, which is in accordance with one embodiment of the present invention. In this particular embodiment, memory tile 22 includes address decode circuitry 32a, 32b, 32c', 32c", sense amplifier circuitry 34, data input/output circuitry 36, redundancy circuitry 38a and 38b, charge source circuitry 24a, voltage level detector 24b, access control logic circuitry 42a, 42b, and memory cells 44. Memory cells 44 maybe dynamic random access memory (DRAM) cells, static random access memory (SRAM) cells, ferroelectric random access memory (FeRAM) cells, magnetoresistive random access memory (MRAM) cells, or electrically erasable read only memory (EEPROM) cells, read only memory (ROM) cells, or other memory cells which are arranged in an array of rows and columns, and randomly accessible.

Access control logic circuitry includes address buffers 42a and timing logic 42b. Access control logic circuitry 42a, 42b are coupled to memory cells 44 and controls accessing of memory cells 44 via address decode circuitry 32a and sense amplifier circuitry 34. It should be appreciated, that if memory cells 44 are DRAM cells, then access control logic circuitry 42a, 42b may also include refresh control circuitry (not shown) which controls refresh of the DRAM cells.

Address decode circuitry includes row decode circuitry 32a, column decode circuitry 32b, and redundancy control logic 32c, which includes row redundancy control logic 32c' and column redundancy control logic 32c". Address decode circuitry 32 is coupled to memory cells 44 and to memory interface circuitry 20 of FIG. 1. During operation, address decode circuitry 32 receive an address from an external logic device, such as an ARM microprocessor, via memory interface circuitry 20 and address buffers 42a. In response to receiving this address, address decode circuitry 32 selectively couple one of the memory cells within memory cells 44 to the external logic device via sense amplifier circuitry 24, data input/output circuitry 36 and memory interface circuitry 20.

Redundancy circuitry 38 includes redundant rows of memory cells 38a and redundant columns of memory cells 38b, and is coupled to address decode circuitry. More specifically, row, redundancy control logic 32c' is coupled to the redundant rows of memory cells 38a and column redundancy control logic 32c" is coupled to the redundant columns of memory cells 38b. Note, that if redundancy control logic 32c receives a redundancy control signal from external logic, then redundancy control logic 32c allows a redundant memory cell within redundancy circuitry 38a, 38b to be addressed by external logic, in place of a selected memory cell within memory cells 44. More specifically, if row redundancy control logic 32c' receives a row redundancy control signal from external logic, then row redundancy control logic 32c' allows a redundant row of memory cells within redundant rows of memory cells 38a to be addressed by external logic, in place of a selected row of memory cells within memory cells 44. Similarly, if column redundancy control logic 32c' receives a column redundancy control signal from external logic, then column redundancy control logic 32c" allows a redundant column of memory cells within redundant columns 38a to be addressed by external logic, in place of a selected column of memory cells within memory cells 44.

Data input/output circuitry 36 includes data buffers 36a and fault logic 36b. Data input/output circuitry 36 is used to read data from or write data to sense amplifier circuitry 34. Data buffers 36a are also coupled to memory interface circuitry 20. Fault logic 36b, which may include error correction logic, is coupled between sense amplifier circuitry 34 and memory interface circuitry 20. According to one embodiment, fault logic 36b detects single and double bit errors within memory cells 44, and corrects single bit errors within memory cells 44.

Sense amplifier circuitry 34 is coupled between memory cells 44 and data buffers 36a. Sense amplifier circuitry 34 is used to read data from and write to memory cells 44.

Charge source circuitry includes charge source 24a and voltage level detector 24b. Charge source circuitry provides all reference voltages required by memory tile 22. For example, if memory tile 22 includes a boosted wordline driver, then charge source circuitry provides the reference voltage for the boosted wordline driver. Similarly, if memory tile 22 includes dynamic memory cells, then charge source circuitry 24 provides a voltage reference for a capacitor plate voltage in the dynamic memory cells. In addition, if memory tile 22 includes a well region which is biased to reduce noise or reduce soft error rate, then charge source circuitry 24 provides the voltage reference for biasing the well region. Furthermore, if memory tile 22 includes logic for reducing the power consumption within memory tile 22, then charge source circuitry 24 provides the reference voltage for this logic.

Figure 5A:
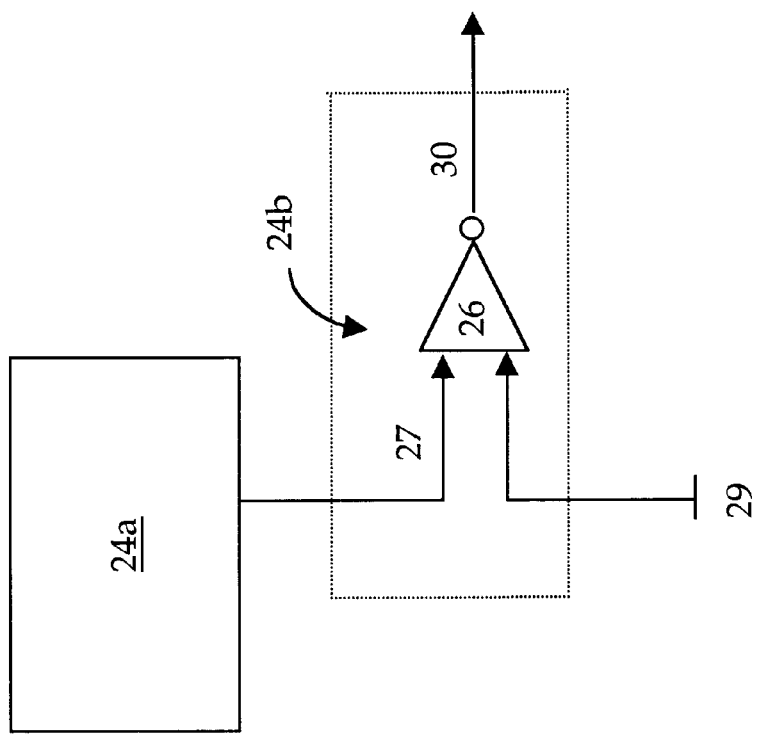
FIG. 5a illustrates in partial logic diagram and partial block diagram form a charge source and voltage level detector of the memory tile of FIG. 4 in accordance with one embodiment of the present invention.

FIG. 5a illustrates in partial logic diagram form and partial block diagram form charge source 24a and voltage level detector 24b of FIG. 4, in accordance with one embodiment of the present invention. In this particular embodiment, voltage level detector 24b includes comparator 26. Charge source 24a provides a reference signal 27 to a first input of comparator 26. A second input of comparator 26 is coupled to a reference signal 29, and the output of comparator 26 is coupled to output signal line 30. Comparator 26 compares reference signal 27 to reference signal 29. If then, difference between the two signals is more than a predetermined value, then comparator 26 provides an output signal to output signal line 30. Thus, voltage level detector 24b detects whether or not charge source 24a is operating correctly. In one embodiment, voltage level detector 24b produces an output signal which disables charge source 24a when voltage level detector 24b detects that charge source 24a is operating incorrectly. In an alternative embodiment, voltage level detector 24b provides an output signal to external logic when it detects that charge source 24a is operating incorrectly. In this case, the output signal may be used to inform external logic that a particular memory tile is not addressable because its charge source is defective. The embodiment illustrated in FIG. 5a provides an exemplar providing a first logical level output when the difference between signals 27 and 29 is in a first voltage range and the opposite logical level when the difference is outside of the first voltage range. Alternate embodiments may employ an alternate logical scheme to provide operating condition information. Alternate embodiments may employ multiple voltage ranges and provide multiple output indications, such a warning of an impending failure.

Figure 5B:
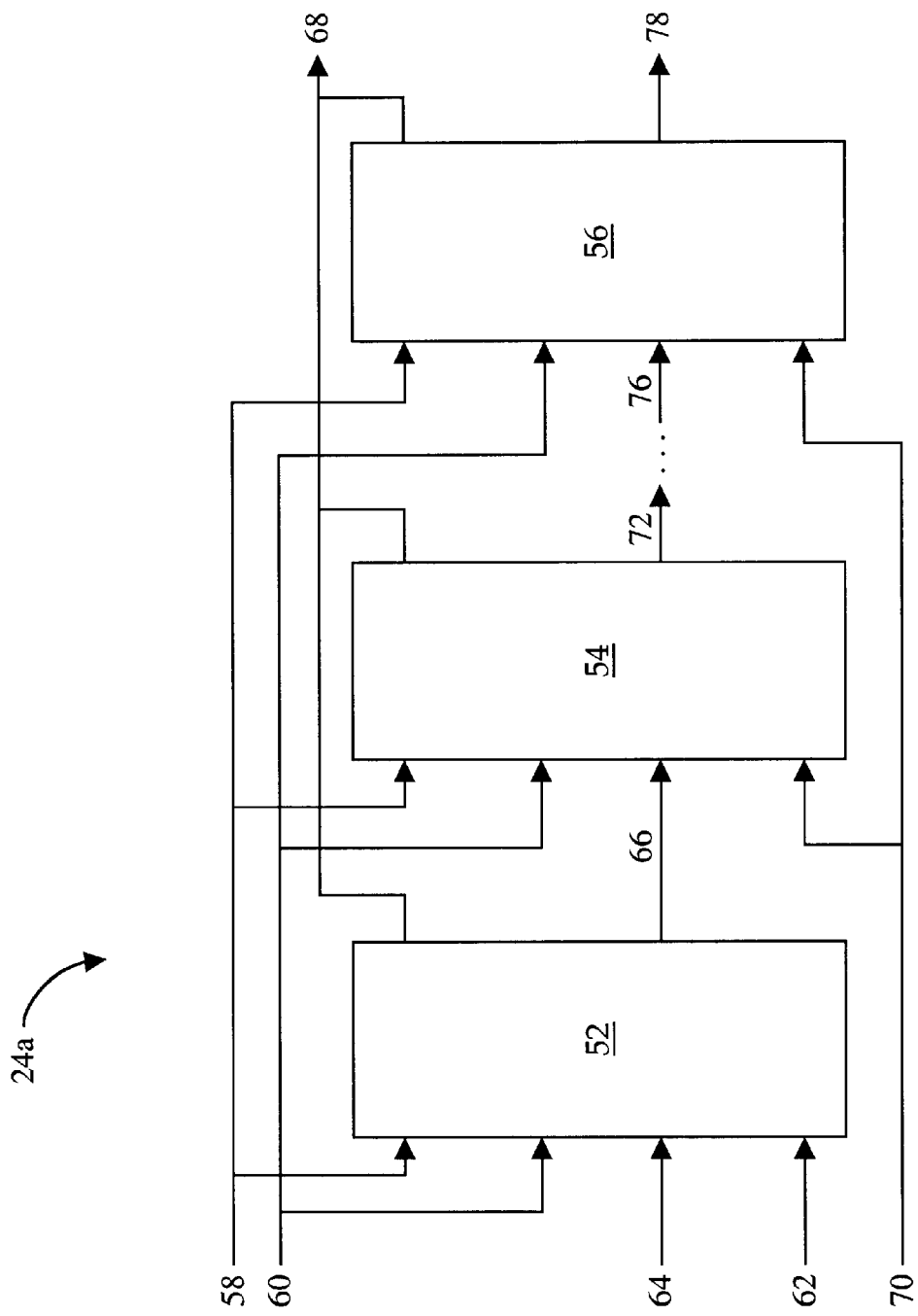
FIG. 5b illustrates in block diagram form a charge source designed in accordance with one embodiment of the present invention.

FIG. 5b illustrates in block diagram form one embodiment of charge source 24a of FIG. 4, which is in accordance with the present invention. In this particular embodiment, charge source 24a includes N atomic charge pumps, where N is equal to or greater than one. The N atomic charge pumps are ganged or connected together in series to form a distributed charge pump. It should be appreciated that the actual number of atomic charge pumps within charge source 24a will depend upon the load which is to be driven by charge source 24a. In FIG. 5b, atomic charge pump 52 is the first stage of the distributed charge pump, atomic charge pump 54 is the second stage of the distributed charge pump, and atomic charge pump 56 is the Nth stage or Nth atomic charge pump in the distributed charge pump.

A first power supply potential 58 is coupled to a first input of atomic charge pump 52, a second power supply potential 60 is coupled to a second input of atomic charge pump 52, an enable signal 62 is coupled to a third input of atomic charge pump 52, and a lock signal 64 is coupled to a fourth input of atomic charge pump 52. A first output of atomic charge pump 52 is coupled to reference signal 68. A second output of atomic charge pump 52 provides a clock signal 66 as an output.

The first power supply potential 58 is coupled to a first input of atomic charge pump 54, the second power supply potential 60 is coupled to a second input of atomic charge pump 54, an enable signal 70 is coupled to a third input of atomic charge pump 54, and clock signal 66 from atomic charge pump 52 is coupled to a fourth input of atomic charge pump 54. A first output of atomic charge pump 54 is coupled to reference signal 68. A second output of atomic charge pump 54 provides clock signal 72 as an output. The clock signal 72 from atomic charge pump 54 is provided as input to the next stage atomic charge pump (not shown).

The first power supply potential 58 is coupled to a first input of atomic charge pump 56, the second power supply potential 60 is coupled to a second input of atomic charge pump 56, the enable signal 70 is coupled to a third input of atomic charge pump 56, and as clock signal 76 is coupled to a fourth input of atomic charge pump 56. The clock signal 76 is received from the previous stage atomic charge pump (not shown). A first output of atomic charge pump 56 is coupled to reference signal 68. A second output of atomic charge pump 56 provides clock signal 78 as an output.

It should be appreciated that charge source 24a reduces supply signal noise. More specifically, we have found that by ganging the atomic charge pumps together and operating them sequentially over time, supply signal noise can be reduced. This occurs because noise created when each charge pump turns on is distributed over time so that noise in the supply or reference signal is spread out over time. It should also be appreciated that charge source 24a also allows power consumption within memory tile 22 to be reduced because portions of charge source 24a can be independently powered down. For example, in FIG. 5b, atomic charge pump 54 and atomic charge pump 56 may be powered down via enable signal 70, while atomic charge pump 52 may be left on via enable signal 62. Thus, with our invention the number of atomic charge pumps operating sequentially is selectable because a subset of the N atomic charge pumps within charge source 24a can be powered down. The embodiment illustrated in FIG. 5b provides a single enable signal 70 to all but atomic charge pump 52. Alternate embodiments may implement the enable signal so as to allow combinations of atomic charge pumps.

Figure 6:
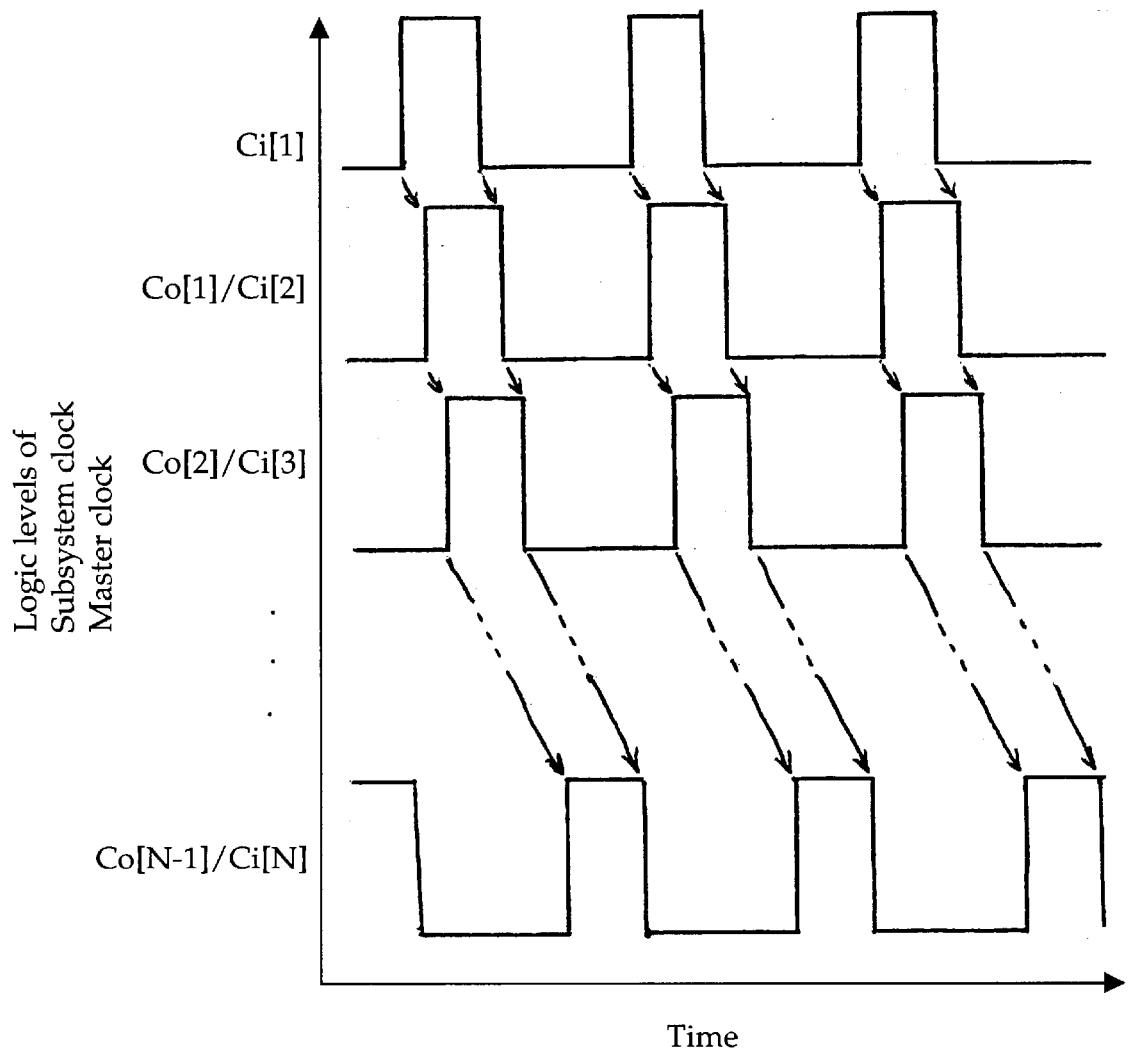
FIG. 6 illustrates a timing diagram for the charge source of FIG. 5b, operated in accordance with one embodiment of the present invention.

Shown in FIG. 6, is a timing diagram for charge source 24a of FIG. 5b, in accordance with one embodiment of the present invention. The horizontal axis represents time, and the vertical axis represents logic levels of clock signals associated with the charge source 24a. Referring again to FIG. 5b, each atomic charge pump 52, 54, . . . 56, has an associated clock input signal 64, 66, . . . 76, respectively, and an associated clock output signal 66, 72, . . . 78, respectively. The input clock signal 64 for the first stage is indicated on the plot of FIG. 6 as Ci[1], where Ci indicates an input clock and the index value in square brackets indicates the stage of the distributed charge pump. Similarly, the output clock signal 66 is indicated as Co[1], where Co indicates an output clock and the index value in square brackets indicates the stage of the distributed charge pump. Note that Co[1], the output clock signal 66 for stage one is the input clock signal 66 for stage two. As such, this signal is only plotted once in FIG. 6. The second stage output clock signal 72 is also illustrated and is indicated by Co[2]. The input clock signal 76 to stage N is indicated as Ci[N].

Specifically, FIG. 6 illustrates how subsequent atomic charge pump stages within charge source 24a are clocked with respect to the initial atomic charge pump stage within charge source 24a. Note, the atomic charge pumps within charge source 24a are prevented from firing at the same time because charge source 24a utilizes a sequential clocking delay scheme, as shown in FIG. 6. For example, the input clock 66 to the second stage is delayed from the input clock 64 to the first stage, as the input clock 66 is generated by the first stage. Each stage has such a relationship with subsequent stages.

Figure 7:
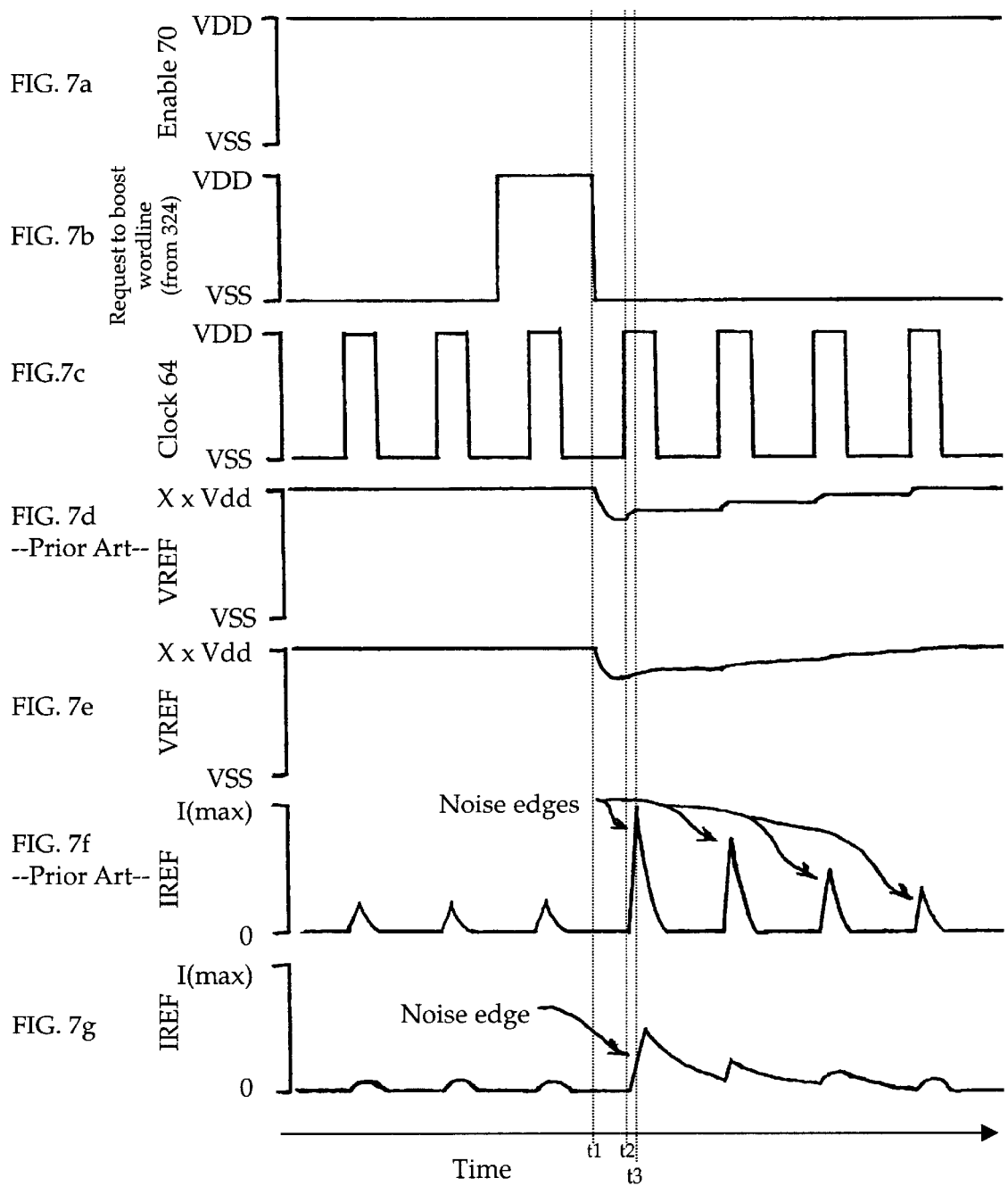
FIGS. 7a–7g illustrate timing diagrams for the charge source of FIG. 5b, operated in accordance with one embodiment of the present invention.

Shown in FIGS. 7a to 7g, are timing diagrams for charge source 24a of FIG. 5b, in accordance with one embodiment of the present invention. In FIGS. 7a to 7g, the reference current noise and the reference voltage for a prior art charge pump, are compared with the reference current noise and the reference voltage of charge source 24a. Moore specifically, FIGS. 7a to 7g illustrate how the sequential clocking of the atomic charge pumps within charge source 24a effects reference current noise and reference voltage, as compared to the prior art. The horizontal axis for the signals illustrated in FIGS. 7a to 7g represents time. The vertical axes for FIGS. 7a to 7E represent the voltage levels of various signals within the charge source 24a. The vertical axes for FIGS. 7f and 7g represent current measurements of the power supply 58 to charge source 24a.

For the condition of FIG. 7a, the enable signal 70 is asserted therefore the N atomic charge sources are all enabled. Enable is asserted by a logical high level at a first supply voltage VDD with reference to a second supply voltage VSS. FIG. 7b illustrates a request to boost the wordline, where the request signal is asserted at time t1. The request is asserted by a logical low level voltage. Note that the request is such as a request by row decoder 32a of FIG. 4. Continuing, FIG. 7c is a plot of the input clock, such as clock 64 to the first stage of the charge source 24a. FIG. 7d illustrates the reference voltage generated in a prior art device such as by voltage reference generator 26 of FIG. 2a. Indicated on the vertical axis is a multiple of the supply voltage VDD, and a second voltage reference VSS. Note that in the prior art reference, in response to assertion of a request signal at a time t1, such as illustrated in FIG. 7b, the voltage drops below its prerequest level. Multiples of Vdd typically used in DRAMs include 2×VDD, 0.5×VDD, and/ or −0.5× VDD. FIG. 7e illustrates the reference voltage generated by the charge source 24a according to one embodiment of the present invention illustrated in FIG. 5b. In response to assertion of the request signal at time t1 the reference voltage signal 68 drops below its prerequest level.

Associated with the conditions illustrated in FIGS. 7a to 7e is a current behavior associated with each power supply. FIG. 7f illustrates the current behavior of the prior art device and FIG. 7g illustrates the current behavior of one embodiment of the present invention. In FIG. 7g, the reference current is measured at the first power supply 58 of FIG. 5b. Note that in both the prior art device and the present invention, there is a current spike associated with each occurrence of the input clock. Note also that the input clock in both the prior art device and the present invention indicates a need to supply charge. As illustrated in FIGS. 7f and 7g, a current spike starts at time t2 in response to assertion of the request signal. The current spike hits a maximum current at time t3. Note that the current spike of the present invention is greatly reduced from the current spike of the prior art device. Subsequent to time t2, a current spike is created with each occurrence of the clock of FIG. 7c. Here again, the current spikes of the present invention are greatly reduced from the current spike of the prior art device. Similarly, referring again to FIGS. 7d and 7e, the behavior of the voltage reference subsequent to time t2 tends to drift back toward the prerequest level. However, the voltage reference of the prior art device is not as smooth as the voltage reference signal 68 of the present invention. Note that the behaviors illustrated in FIGS. 7a to 7g is exemplar of any conditions and operations which request of a charge demand for plate voltage in DRAM or back body supply for well of the DRAM, or any other increased demand for charge. The noise also effects retention time for a DRAM, and may cause electromagnetic interference. The present invention greatly reduces the noise and reduces the effect of noise on the electromagnetic interference (EMI) signature by spreading the noise spectrum.

Shown in FIGS. 8a–8g is another timing diagram for charge source 24a of FIG. 5b, in accordance with one embodiment of the present invention. In FIGS. 8a–8g, the reference current noise and the reference voltage noise for a prior art charge pump, is compared with the reference current noise and the reference voltage noise of charge source 24a. More specifically, FIGS. 8a–8g illustrates how enablement of the atomic charge pumps within charge source 24a effects reference current noise and reference voltage noise, as compared to the prior art.

Figure 8:
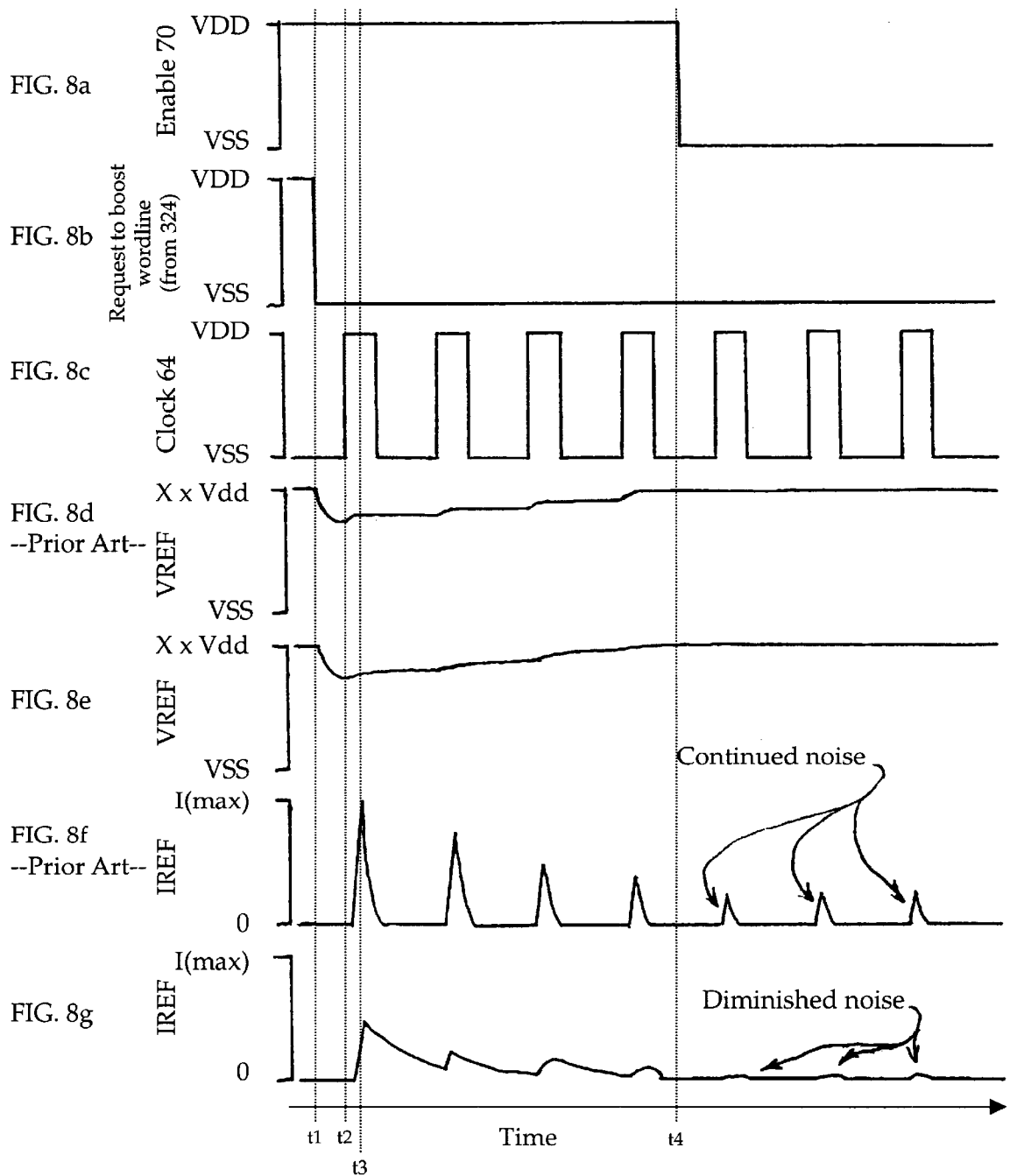
FIGS. 8a–8g illustrate timing diagrams for the charge source of FIG. 5b, operated in accordance with one embodiment of the present invention.

For the condition of FIG. 8a, the enable signal 70 is asserted prior to t2, where the N atomic charge sources are all enabled, and the enable signal 70 is disabled at time t4. Enable is asserted by a logical high level at a first supply voltage VDD with reference to a second supply voltage VSS, and negated by a logical low level. Similar to FIG. 7b, FIG. 8b illustrates a request to boost the wordline, where the request signal is asserted at time t1. The request is asserted by a logical low level voltage. Note that the request is such as a request by row decoder 32a of FIG. 4. Continuing, FIG. 8c is a plot of the input clock, such as clock 64 to the first stage of the charge source 24a. FIG. 8d illustrates the reference voltage generated in a prior art device such as by voltage reference generator 26 of FIG. 2a. Indicated on the vertical axis is a multiple of the supply voltage VDD, and a second voltage reference VSS. Note that in the prior art reference, in response to assertion of a request signal at a time t1, such as illustrated in FIG. 8b, the voltage drops below its prerequest level. FIG. 8e illustrates the reference voltages generated by the charge source 24a according to one embodiment of the present invention illustrated in FIG. 5b. In response to assertion of the request signal at time t1 the reference voltage signal 68 drops below its prerequest level.

Associated with the conditions illustrated in FIGS. 8a to 8e is a current behavior associated with each power supply. FIG. 8f illustrates the current behavior of the prior art device, and FIG. 8g illustrates the current behavior of one embodiment of the present invention. In FIG. 8g, the reference current is measured at the first power supply 58 of FIG. 5b. Note that in both the prior art device and the present invention, there is a current spike associated with each occurrence of the input clock. Note also that the input clock in both the prior art device and the present invention indicates a need to supply charge. As illustrated in FIGS. 8f and 8g, a current spike starts at time t2 in response to the rising edge of the clock after assertion of the request signal. The current spike hits a maximum current at or about time t3. Note that the current spike of the present invention is greatly reduced from the current spike of the prior art device. Subsequent to time t3, a current spike is created with each occurrence of the clock of FIG. 8c. Here again, the current spikes of the present invention are greatly reduced from the current spikes of the prior art device. Similarly, referring again to FIGS. 8d and 8e, the behavior of the voltage reference subsequent to time t3 tends to drift back toward the prerequest level. However, the voltage reference of the prior art device is not as smooth as the voltage reference signal 68 of the present invention. Note that the behaviors illustrated in FIGS. 8a to 8g is exemplar of any conditions and operations which request of a charge demand for plate voltage in DRAM or back body supply for well of the DRAM, or any other increased demand for charge.

FIGS. 8f and 8g illustrate another advantage of the present invention, where it is possible to disable atomic charge sources and thus reduce the current further. This is clearly seen subsequent to time t4 where the enable signal 70 is negated and the atomic charge sources are disabled. The effect of disabling the atomic charge sources is to greatly diminish the current level, as illustrated in FIG. 8g. The current spikes are referred to as noise edges and are detrimental in battery operated system as the draw excess power. The present invention overcomes the detrimental effects of the noise spikes by reducing the amplitude of the current overall, and also by allowing portions of the distributed charge pump to be disabled.

Figure 9:
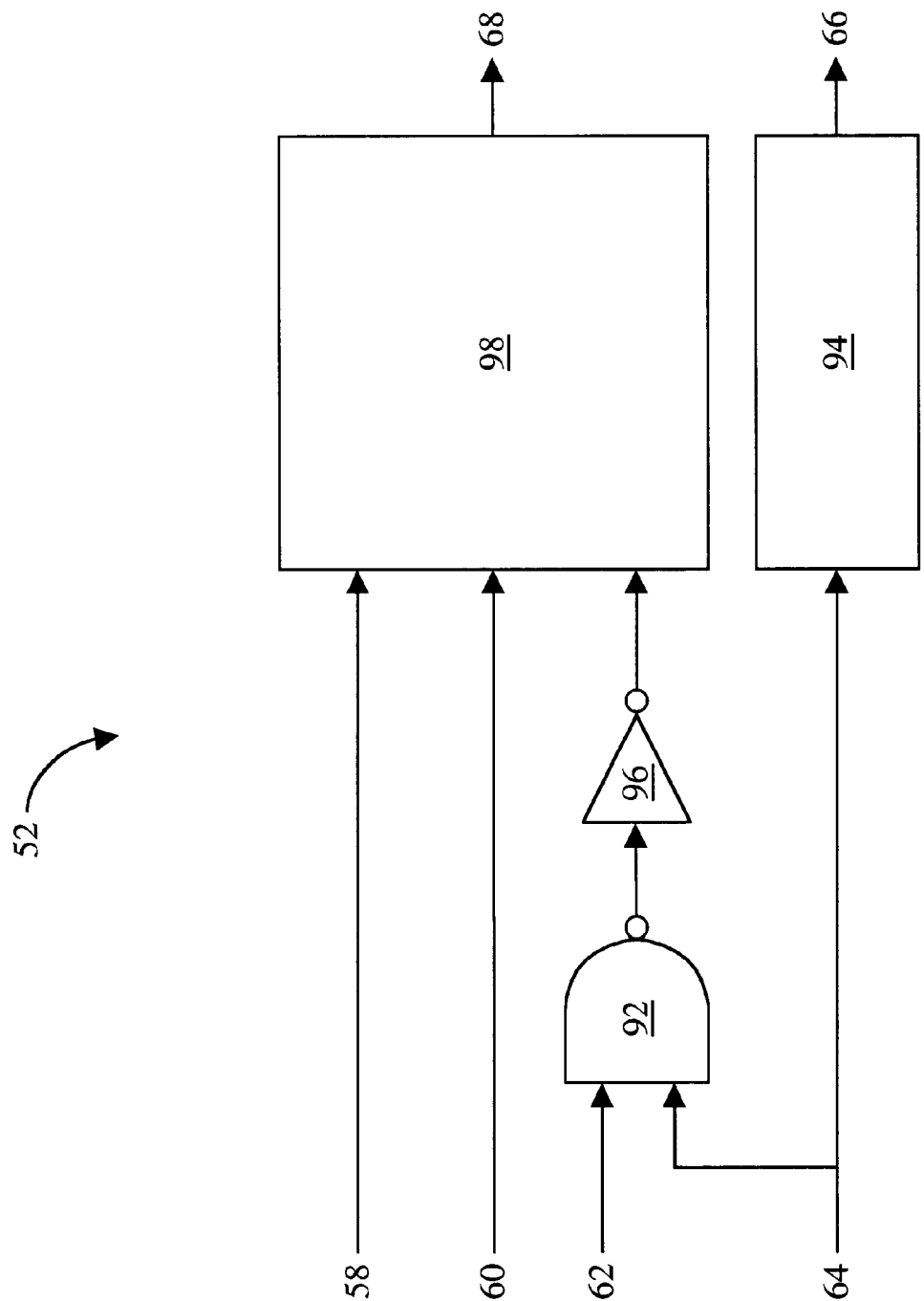
FIG. 9 illustrates in partial logic diagram form and partial block diagram form an atomic charge pump designed in accordance with one embodiment of the present invention.

FIG. 9 illustrates in partial logic diagram form and partial block diagram form atomic charge pumps 52 of FIG. 5b, which is in accordance with one embodiment of the present invention. In this particular embodiment, atomic charge pump 52 includes a NAND gate 92, a delay circuit 94, an inverter 96, and pump circuitry 98. NAND gate 92 receives enable signal 62 and clock signal 64 as inputs. The output of NAND gate 92 is coupled to the input of inverter 96. The output of inverter 96 is coupled to pump circuitry 98. The first power supply potential 58 and the second power supply potential 60 are coupled to pump circuitry 98. The output of pump circuitry 98 is coupled to reference signal 68. Delay circuit 94 also receives clock signal 64 as an input and provides clock signal 66 as an output.

Note, that atomic charge pump 54 may be formed in a similar manner. In this case NAND gate 92 would receive enable signal 70 and clock signal 66 as inputs, and delay circuit 94 would receive clock signal 66 as an input and provide clock signal 72 as an output. Similarly, for atomic charge pump 56 NAND gate 92 would receive enable signal 70 and clock signal 76 as inputs, and delay circuit 94 would receive clock signal 76 as an input and provide clock signal 78 as an output.

Figure 10:
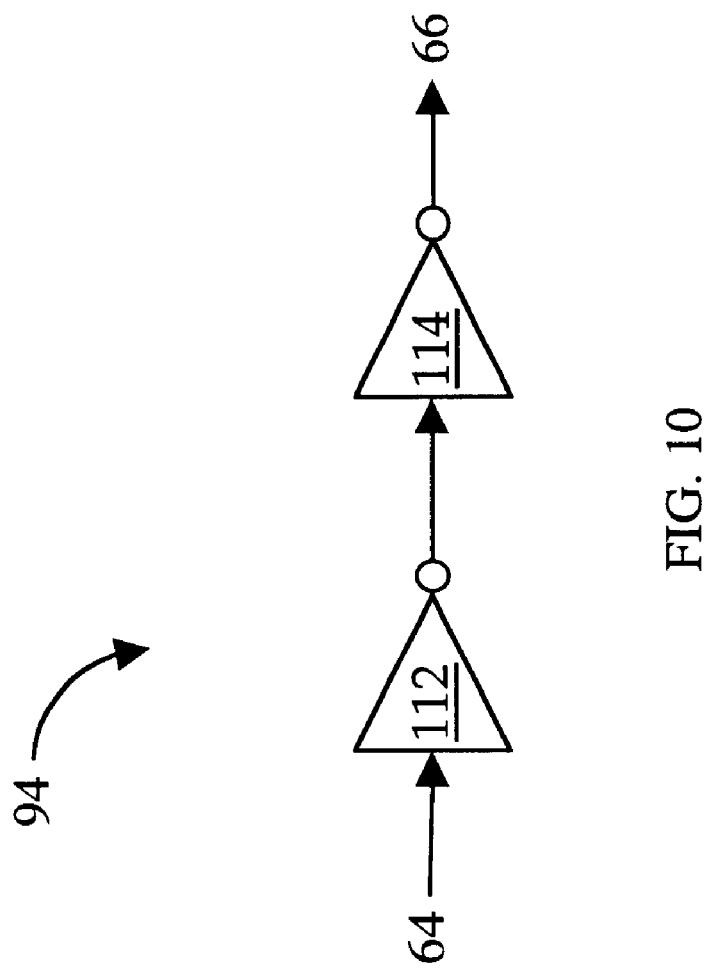
FIG. 10 illustrates in logic diagram form a delay circuit designed in accordance with one embodiment of the present invention.

FIG. 10 illustrates in logic diagram form one embodiment of delay circuit 94 of FIG. 9, which is in accordance with the present invention. In this particular embodiment, delay circuit 94 includes an inverter 112 and an inverter 114. Inverter 112 receives clock signal 64 as an input and the output of inverter 112 is coupled to the input of inverter 114. The output of inverter 114 provides clock signal 66 as an output.

Note that the delay circuit for atomic charge pump 54 may be formed in a similar manner. In this case inverter 112 would receive clock signal 66 as an input and the output of inverter 114 would provide clock signal 72 as an output. Similarly, for atomic charge pump 56 inverter 112 would receive clock signal 76 as an input and the output of inverter 114 would provide clock signal 78 as an output.

Figure 11:
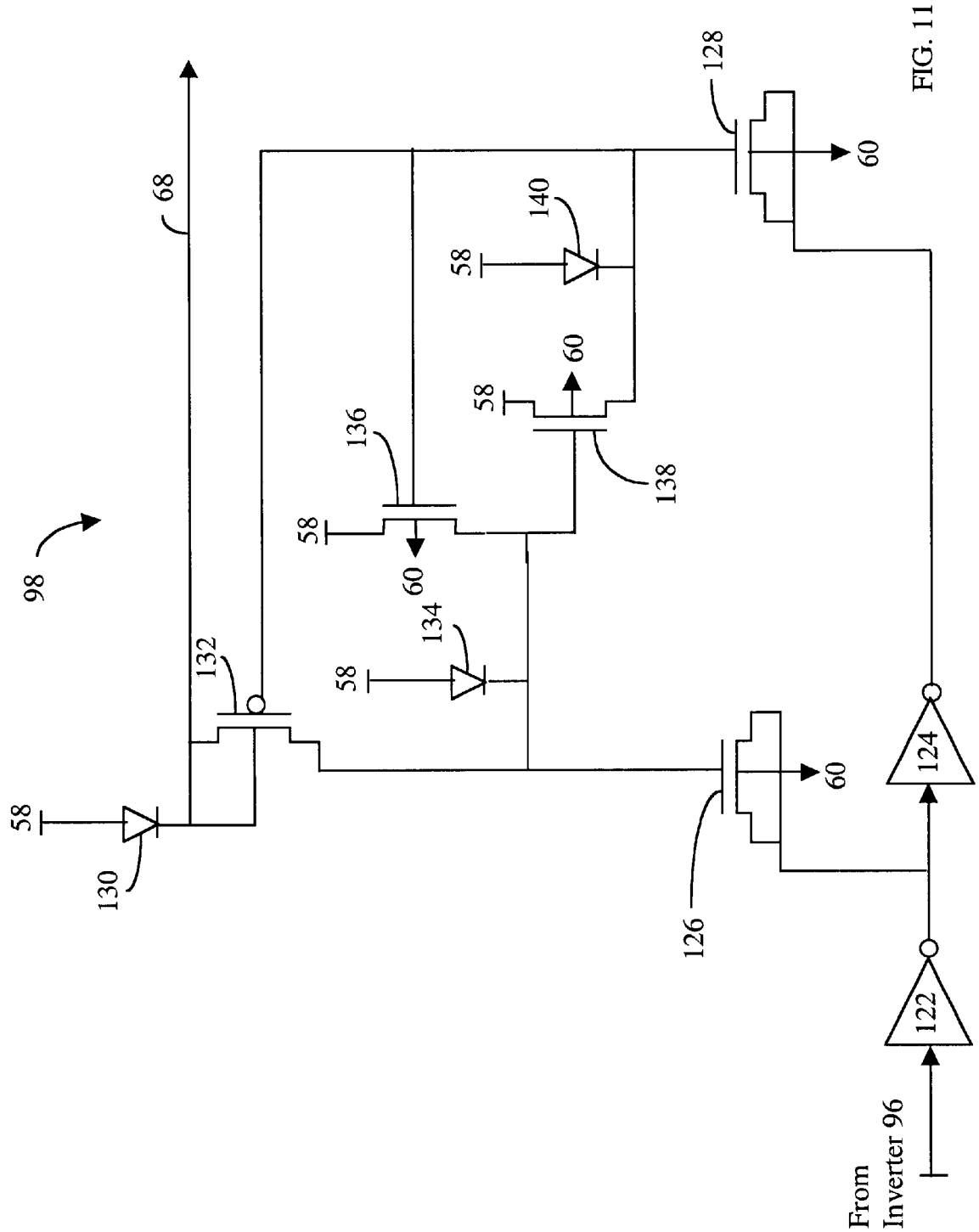
FIG. 11 illustrates in circuit diagram form charge pump circuitry designed in accordance with one embodiment of the present invention.

FIG. 11 illustrates in circuit diagram form one embodiment of pump circuitry 98 of FIG. 9, which is in accordance with the present invention. In this particular embodiment pump circuitry 98 is a single stage pump and it includes an inverter 122, an inverter 124, an NMOS transistor 126, an NMOS transistor 128, a diode 130, a PMOS transistor 132, a diode 134, an NMOS transistor 136, an NMOS transistor 138, and a diode 140.

The input of inverter 122 .is coupled to the output of inverter 96 of FIG. 9. The output of inverter 122 is coupled to the input of inverter 124 and to the source region and the drain region of NMOS transistor 126. Reference voltage signal 68 is coupled to the output of diode 130, and the substrate region and the drain region of PMOS transistor 132. The source region of PMOS transistor 132 is coupled to the gate electrode of NMOS transistor 126, the output of diode 134, the gate electrode of NMOS transistor 138, and the source region of NMOS transistor 136. The source region of NMOS transistor 138 is coupled to the output of diode 140, the gate electrode of NMOS transistor 128, the gate electrode of NMOS transistor 136, and the gate electrode of PMOS transistor 132. The source region and the drain region of NMOS transistor 128 are coupled to the output of inverter 124. The substrate regions of NMOS transistor 126, NMOS transistor 128, NMOS transistor 138, and NMOS transistor 136 are all coupled to the second power supply potential 60. The input of diode 130, the input of diode 134, the input of diode 140, the drain region of NMOS transistor 136, and the drain region of NMOS transistor 138 are all coupled to the first power supply potential 58.

Figure 12:
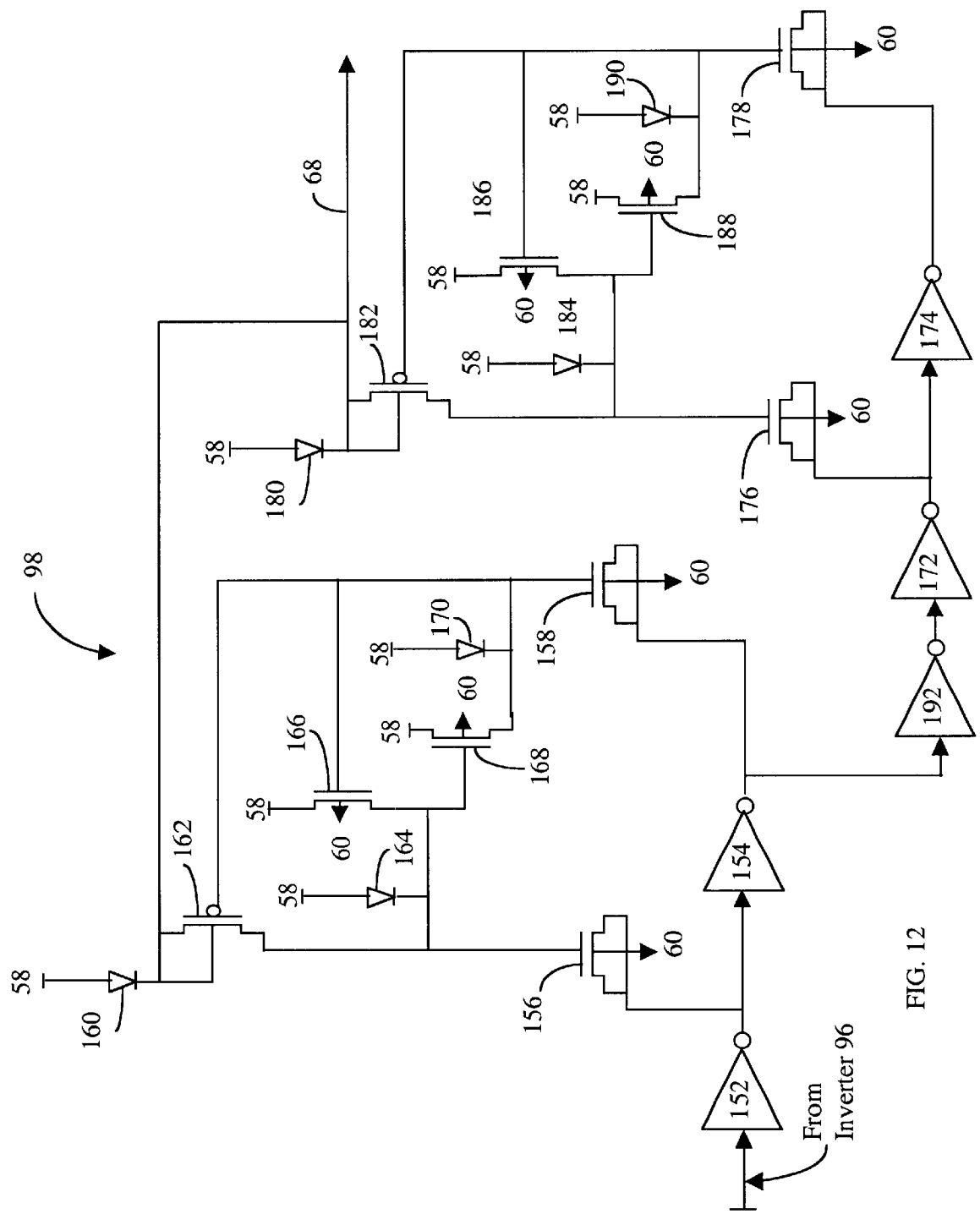
FIG. 12 illustrates in circuit diagram form charge pump circuitry designed in accordance with an alternative embodiment of the present invention.

FIG. 12 illustrates in circuit diagram form an alternative embodiment of pump circuitry 98 of FIG. 9, which is in accordance with the present invention. In this particular embodiment pump circuitry 98 is a two stage pump and it includes an inverter 152, an inverter 154, an NMOS transistor 156, an NMOS transistor 158 a diode 160, a NMOS transistor 162, a diode 164, an NMOS transistor 166, an NMOS transistor 168, a diode 170, an inverter 172, an inverter 174, an NMOS transistor 176, an NMOS transistor 178, a diode 180, a PMOS transistor 182, a diode 184, an NMOS transistor 186, an NMOS transistor 188, a diode 190, and an inverter 192.

In the first stage, the input of inverter 152 is coupled to the output of inverter 96 of FIG. 9. The output of inverter 152 is coupled to the input of inverter 154 and to the source region and the drain region of NMOS transistor 156. Reference voltage signal 68 is coupled to the output of diode 160, and the substrate region and the drain region of PMOS transistor 162. The source region of PMOS transistor 162 is coupled to the gate electrode of NMOS transistor 156, the output of diode 164, the gate electrode of NMOS transistor 168, and the source region of NMOS transistor 166. The source region of NMOS transistor 168 is coupled to the output of diode 170, the gate electrode of NMOS transistor 158, the gate electrode of NMOS transistor 166, and the gate electrode of PMOS transistor 162. The source region and the drain region of NMOS transistor 158 are coupled to the output of inverter 154. The substrate regions of NMOS transistor 156, NMOS transistor 158, NMOS transistor 168, and NMOS transistor 166 are all coupled to the second, power supply potential 60. The input of diode 160, the input of diode 164, the input of diode 170, the drain region of NMOS transistor 166, and the drain region of NMOS transistor 168 are all coupled to the first power supply potential 58. The gate of transistor 168 is coupled to the output of diode 164, the source of transistor 166, the gate of transistor 156, and the source of transistor 162.

In the second stage, the input of inverter 192 is coupled to the output of inverter 154. The output of inverter 192 is coupled to the input of inverter 172. The output of inverter 172 is coupled to the input of inverter 174 and to the source region and the drain region of NMOS transistor 176. Reference voltage signal 68 is coupled to the output of diode 180, and the substrate region and the drain region of PMOS transistor 182. The source region of PMOS transistor 182 is coupled to the gate electrode of NMOS transistor 176, the output of diode 184, the gate electrode of NMOS transistor 188, and the source region of NMOS transistor 186. The source region of NMOS transistor 188 is coupled to the output of diode 190, the gate electrode of NMOS transistor 178, the gate electrode of NMOS transistor 186, and the gate electrode of PMOS transistor 182. The source region and the drain region of NMOS transistor 178 are coupled to the output of inverter 174. The substrate regions of NMOS transistor 176, NMOS transistor 178, NMOS transistor 188, and NMOS transistor 186 are all coupled to the second power supply potential 60. The input of diode 180, the input of diode 184, the input of diode 190, the drain region of NMOS transistor 186, and the drain region of NMOS transistor 188 are all coupled to the first power supply potential 58.

Figure 13:
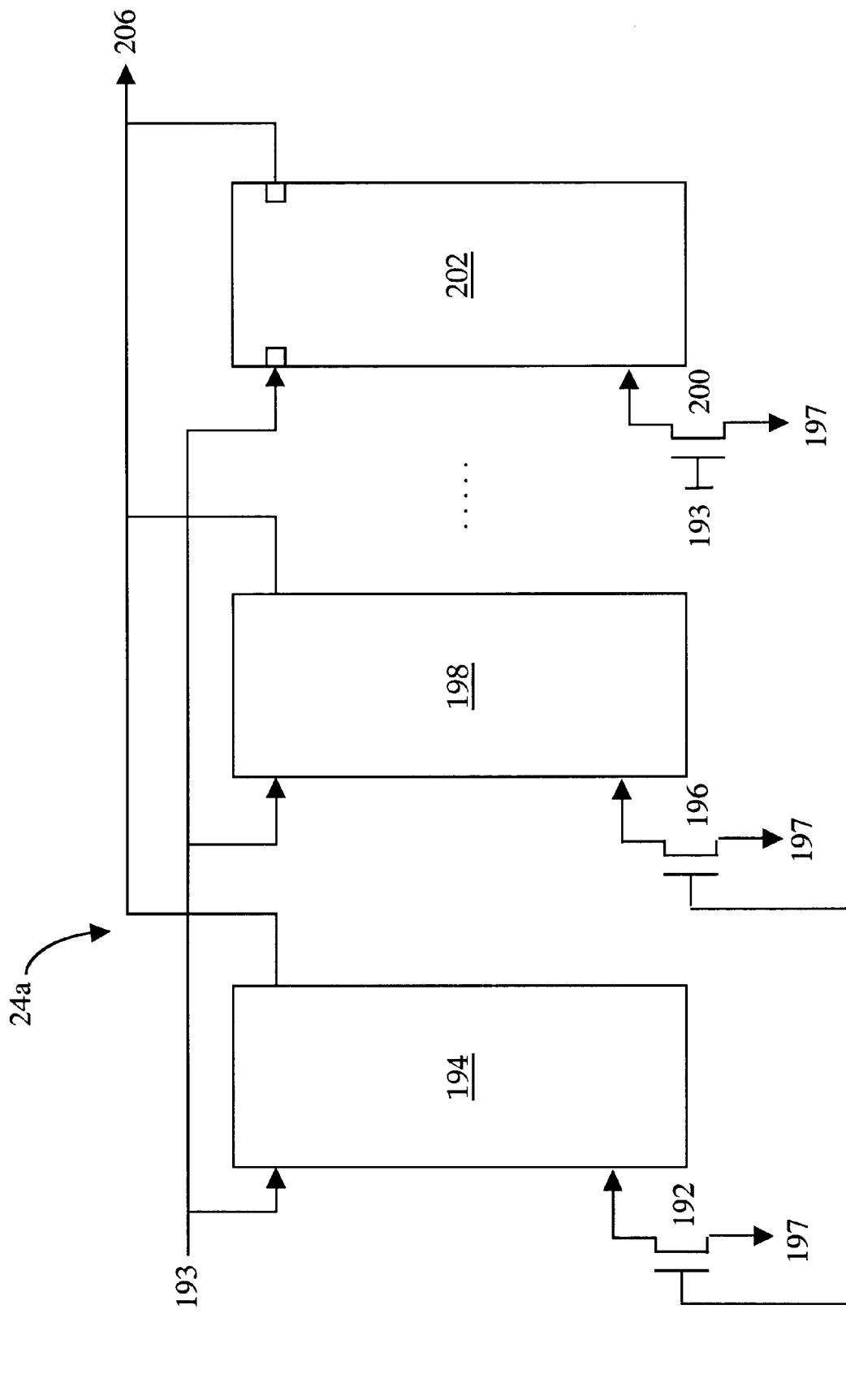
FIG. 13 illustrates in partial circuit diagram form and partial block diagram form a charge source designed in accordance with an alternative embodiment of the present invention.

FIG. 13 illustrates in partial circuit diagram form and partial block diagram form an alternative embodiment of charge source 24a of FIG. 4, which is in accordance with the present invention. In this particular embodiment, charge source 24a includes NMOS transistor 192, atomic voltage regulator 194, NMOS transistor 196, atomic voltage regulator 198, NMOS transistor 200, and atomic voltage regulator 202. In this embodiment N, where N is equal to or greater than one, atomic voltage regulators are ganged or connected together in series to form a distributed voltage regulator. It should be appreciated that the actual number of atomic voltage regulators within charge source 24a will depend upon the load which is to be driven by charge source 24a. In FIG. 13, atomic voltage regulator 194 is the first stage of the distributed voltage regulator, atomic voltage regulator 198 is the second stage of the distributed voltage regulator, and atomic voltage regulator 202 is the Nth stage for Nth atomic voltage regulator in the distributed voltage regulator.

As shown in FIG. 13, enable signal 204 is coupled to the gate electrode of NMOS transistor 192 and the gate electrode of NMOS transistor 196. A first power supply potential 193, similar to potential 58 of the embodiment illustrated in FIG. 5b, is coupled to a first input of atomic voltage regulator 194, a first input of atomic voltage regulator 198, a first input of atomic voltage regulator 202, and the gate electrode of NMOS transistor 200. The drain region of NMOS transistor 192 is coupled to a second input of atomic voltage regulator 194. The drain region of NMOS transistor 196 is coupled to a second input of atomic voltage regulator 198. The drain region of NMOS transistor 200 is coupled to a second input of atomic voltage regulator 202. Reference signal 206, similar to signal 68 of the embodiment illustrated in FIG. 5b, is coupled to the output of atomic voltage regulator 194, the output of atomic voltage regulator 196, and the output of atomic voltage regulator 202. A second power supply potential 197, similar to potential 60 of the embodiment illustrated in FIG. 5b, is coupled to the source region of NMOS transistor 192, the source region of NMOS transistor 196, and the source region of NMOS transistor 200.

It should also be appreciated that charge source 24a allows power consumption within memory tile 22 to be reduced because portions of charge source 24a can be independently powered down. For example, in FIG. 13 atomic voltage regulator 194 and atomic voltage regulator 198 may be powered down via enable signal 204, while atomic voltage regulator 202 remains enabled via the first power supply potential 193. Thus, with our invention the number of atomic voltage regulators operating simultaneously is selectable because a subset of the N atomic voltage regulators within charge source 24a can be powered down.

Figure 14:
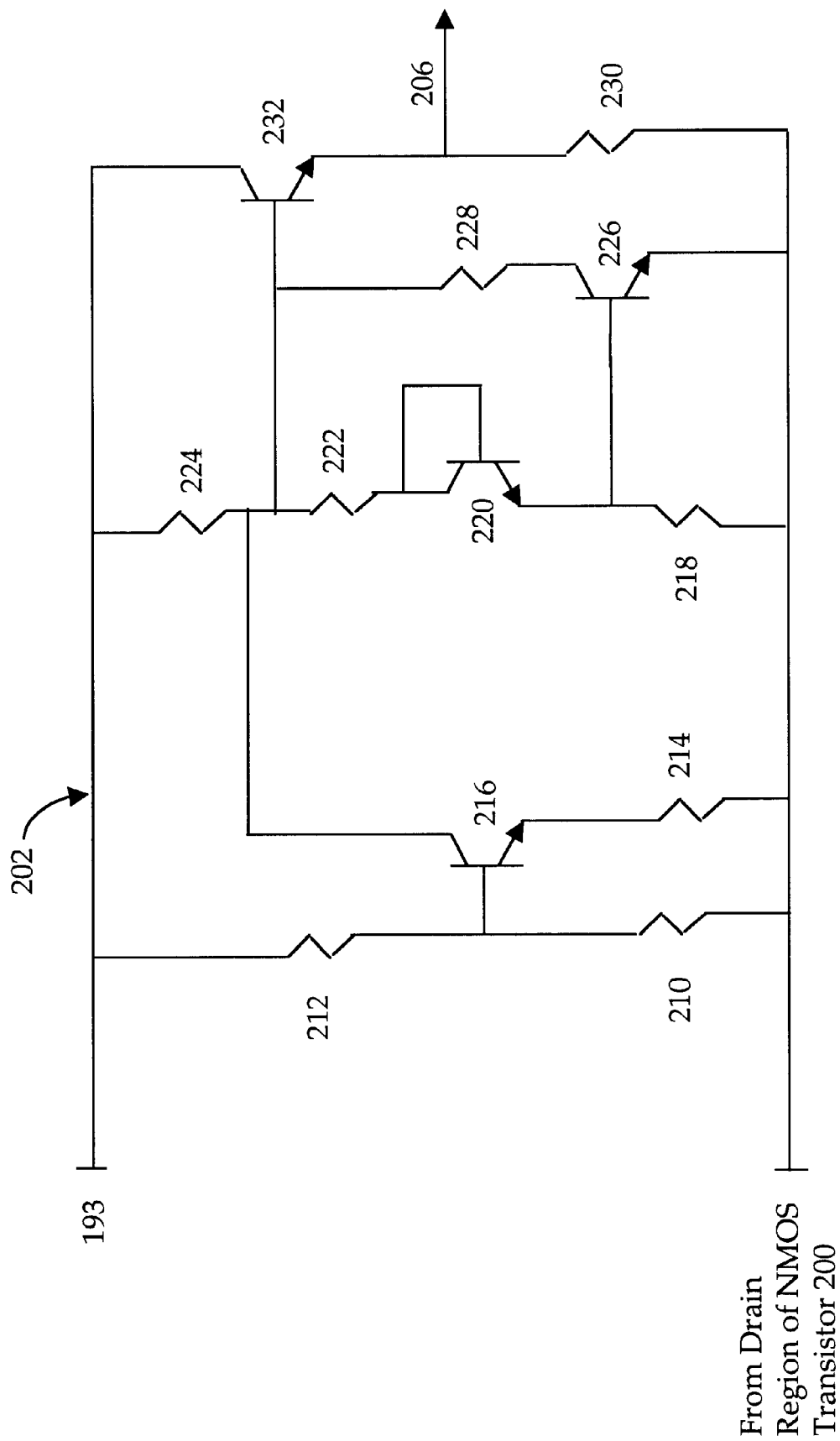
FIG. 14 illustrates in circuit diagram form an atomic voltage regulator designed in accordance with one embodiment of the present invention.

Shown in FIG. 14, is a circuit schematic for atomic voltage regulator 202 of FIG. 13, which is in accordance with one embodiment of the present invention. In this particular embodiment, atomic voltage regulator 202 includes a resistor 210, a resistor 212, a resistor 214, a NPN bipolar transistor 216, a resistor 218, a NPN bipolar transistor 220, a resistor 222, a resistor 224, a NPN bipolar transistor 226, a resistor 228, a resistor 230, and a NPN bipolar transistor 232.

The drain region of NMOS transistor 200 of FIG. 13 is coupled to a first terminal of resistor 210, a first. terminal of resistor 214, a first terminal of resistor 218, a first terminal of resistor 230, and the emitter region of NPN bipolar transistor 226. The second terminal of resistor 210 is coupled to a first terminal of resistor 212 and to the base region of NPN bipolar transistor 216. The second terminal of resistor 212, a first terminal of resistor 224, and the collector region of NPN bipolar transistor 232 is coupled to the first power supply potential 193. The second terminal of resistor 214 is coupled to the emitter region of NPN bipolar transistor 216. The collector region of NPN bipolar transistor 216 is coupled to the second terminal of resistor 224, the base region of NPN bipolar transistor 232, a first terminal of resistor 222, and a first terminal of resistor 228. The second terminal of resistor 222 is coupled to the base and collector region of NPN bipolar transistor 220. The emitter region of NPN bipolar transistor 220 is coupled to the second terminal of resistor 218 and the base region of NPN bipolar transistor 226. The collector region of NPN bipolar transistor 226 is coupled to the second terminal of resistor 228. The emitter region of NPN bipolar transistor 232 and the second terminal of resistor 230 are coupled to reference signal 206. Note, the operation of the circuit illustrated in FIG. 14 is described in U.S. Pat. No. 4,570,114, and the subject matter of U.S. Pat. No. 4,570,114 is expressly incorporated herein by reference.

Note, that atomic voltage regulator 194 may be formed in a similar manner. In this case the drain region of NMOS transistor 192, of FIG. 13, would be connected the first terminal off resistor 210, the first terminal of resistor 214, the first terminal of resistor 218, the first terminal of resistor 230, and the emitter region of NPN bipolar transistor 226. Similarly, for atomic voltage regulator 198 the drain region of NMOS transistor 196, of FIG. 13, would be coupled to the first terminal of resistor 210, the first terminal of resistor 214, the first terminal of resistor 218, the first terminal of resistor 230, and the emitter region of NPN bipolar transistor 226.

Figures 15A, 15B, 15C:
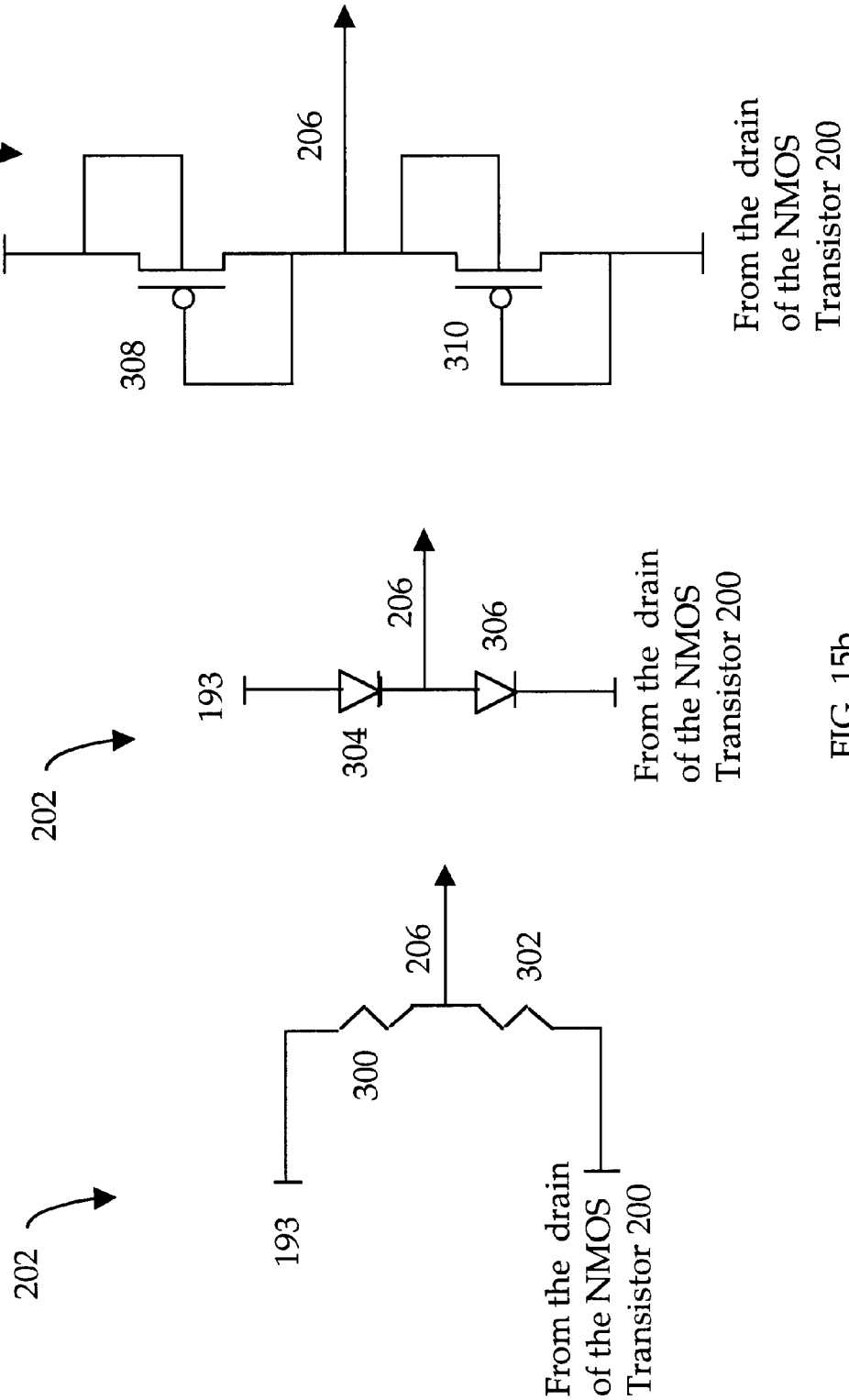
FIG. 15a illustrates in circuit diagram form an atomic voltage regulator designed in accordance with an alternative embodiment of the present invention.
FIG. 15b illustrates in circuit diagram form an atomic voltage regulator designed in accordance with an alternative embodiment of the present invention.
FIG. 15c illustrates in circuit diagram form an atomic voltage regulator designed in accordance with an alternative embodiment of the present invention.

FIG. 15a illustrates in circuit diagram form an alternative embodiment of atomic voltage regulator 202 of FIG. 13, which is in accordance with the present invention. In this particular embodiment atomic voltage regulator 202 includes resistor 300 and resistor 302.

A first terminal of resistor 300 is coupled to first power supply potential 193. Reference signal 206 is coupled to the second terminal of resistor 300 and a first terminal of resistor 302. The second terminal of resistor 302 is coupled to the drain of NMOS transistor 200. Note, that atomic voltage regulator 194 may be formed in a similar manner. In this case the drain region of NMOS transistor 192 would be connected to the second terminal of resistor 302. Similarly, for atomic voltage regulator 198 the drain region of NMOS transistor 196 would be connected to the second terminal of resistor 302.

FIG. 15b illustrates in circuit diagram form an alternative embodiment of atomic voltage regulator 202 of FIG. 13, which is in accordance with the present invention. In this particular embodiment atomic voltage regulator 202 includes diode 304 and diode 306.

The input of diode 304 is coupled to the first power supply potential 193. Reference signal 206 is coupled to the output of diode 304 and the input of diode 306. The out put of diode 306 is coupled to the drain of NMOS transistor 200. Note, that atomic voltage regulator 194 and atomic voltage regulator 198 may be configured in a similar manner. Note, that atomic voltage regulator 194 may be formed in a similar manner. In this case the. drain region of NMOS transistor 192 would be connected to the output of diode 306. Similarly, for atomic voltage regulator 198 the drain region of NMOS transistor 196 would be connected to the output of diode 306.

FIG. 15c illustrates in circuit diagram form an alternative embodiment of atomic voltage regulator 202 of FIG. 13, which is in accordance with the present invention. In this particular embodiment atomic voltage regulator 202 includes PMOS transistor 308 and PMOS transistor 310.

Thee substrate region and the drain region of PMOS transistor 308 are coupled to the first power supply potential 193. Reference signal 206 is coupled to the gate electrode and source region of PMOS transistor 308, and to the substrate region and drain region of PMOS transistor 310. The drain region of NMOS transistor 200 is coupled to the gate electrode and source region of PMOS transistor 310. Note, that atomic voltage regulator 194 may be formed in a similar manner. In this case the drain region of NMOS transistor 192 would be connected to the substrate region and drain region of PMOS transistor 310. Similarly, for atomic voltage regulator 198 the drain region of NMOS transistor 196 would be connected to the substrate region and drain region of PMOS transistor 310.

Figure 16:
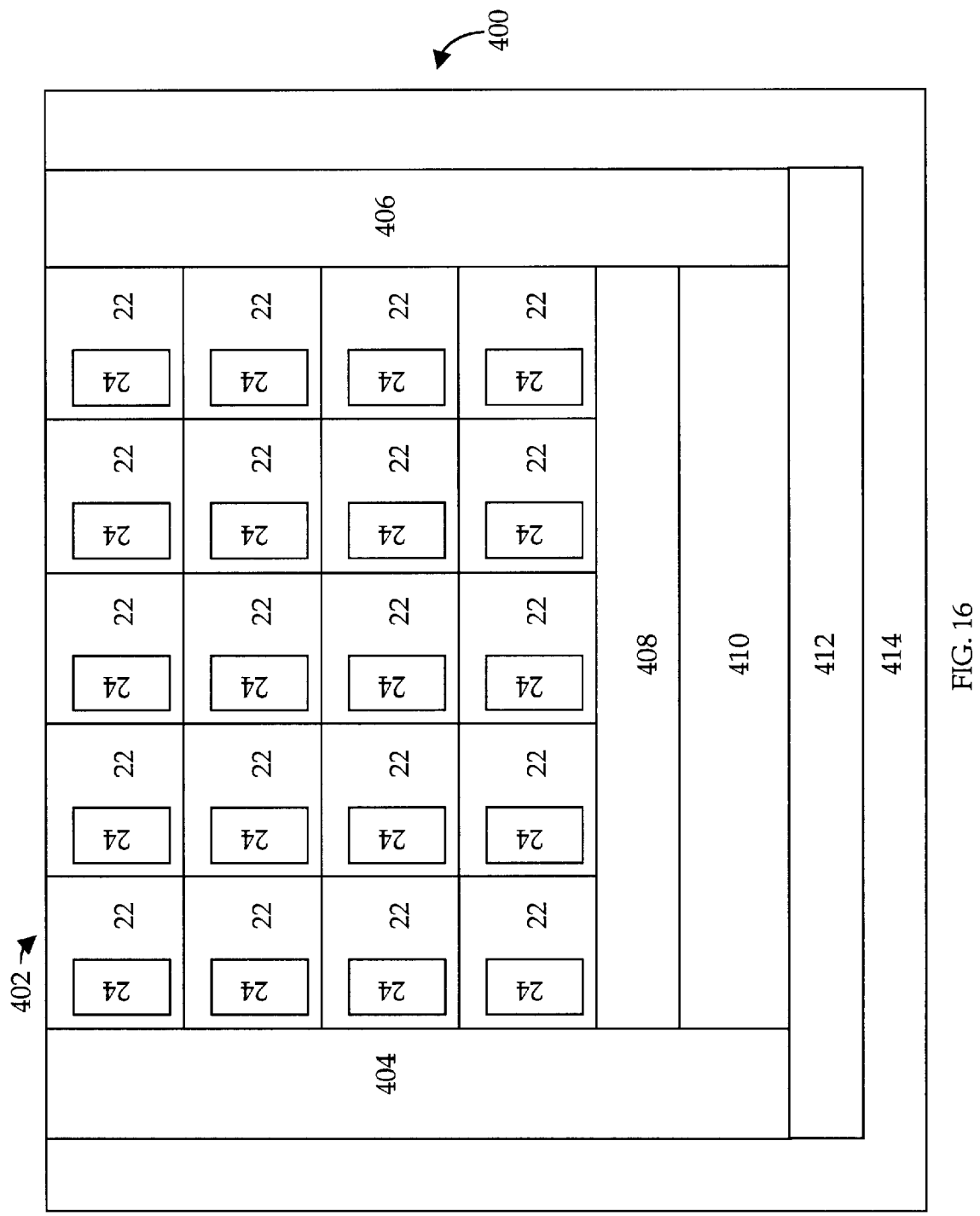
FIG. 16 illustrates an integrated circuit device designed in accordance with an alternative embodiment of the present invention.

FIG. 16 illustrates in block diagram form an integrated circuit device 400 that is in accordance with an alternative embodiment of the present invention. In this particular embodiment integrated circuit device 400 includes a tiled memory array 402, fuse circuitry 404, error detection and correction circuitry 406, test circuitry 408, memory interface circuitry 410, logic circuitry 412, and input/output circuitry 414.

Fuse circuitry 404 is coupled to tiled memory array 402 and is used to repair defects within tiled memory array 402. Error detection and correction circuitry 406 is coupled to tiled memory array 402 and detects and corrects errors within tiled memory array 402. Note, error detection and correction circuitry 406 may be used to correct soft or hard errors. Test circuitry 408 is coupled to tiled memory array 402 and is used to test tiled memory array 402. In one embodiment, test circuitry 408 is built in self test (BIST) circuitry. In an alternative embodiment, test circuitry is built in self repair (BISR) circuitry. In another embodiment, test circuitry 408 includes both BIST circuitry and BISR circuitry. Memory interface circuitry 410 is coupled to tiled memory array 402 and contains circuitry which allows tiled memory array 402 to interface with logic circuitry 412. More specifically, memory interface circuitry 410 contains circuitry which allows tiled memory array 402 to interface with different logic architectures. For example, if logic circuitry 412 includes an ARM microprocessor, then memory interface circuitry 410 includes circuitry which allows tiled memory array 402 to interface with the ARM microprocessor. In one embodiment, memory interface circuitry 410 includes a DRAM controller. In alternative an embodiment, memory interface 410 includes refresh control circuitry which allows tiled memory array 402 to interface with logic circuitry. In another embodiment, memory interface circuitry 410 includes circuitry which controls the power consumption of memory array 402, and thus allows tiled memory array 402 to interface with logic circuitry 412. Note, tiled memory array 402 includes a plurality of memory tiles 22, and each of the memory tiles 22 contains its own charge source circuitry 24, as previously discussed above. It should be appreciated that in this particular embodiment memory tiles 22 have been used to form tiled memory array 402 that is embedded within integrated circuit 400.

Figure 17:
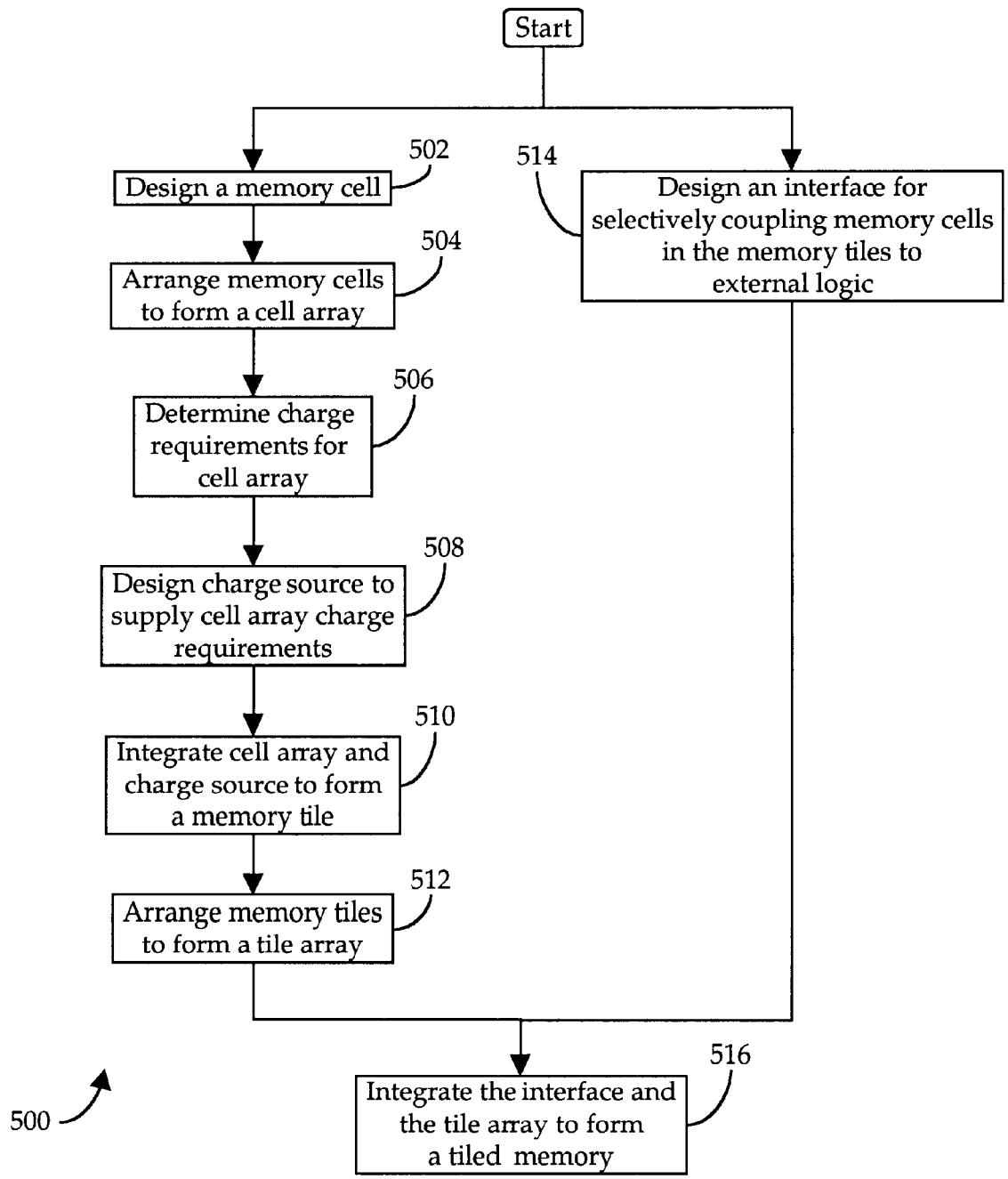
FIG. 17 illustrates in flow diagram form a process for designing a tiled memory in accordance with one embodiment of the present invention.

It should be appreciate d that tiled memory devices and integrated circuit devices having an embedded tiled memory can be advantageously fabricated with the present invention because once a memory tile has been designed it can be used to form a multitude of memory array instantiations. The process flow 500 for designing a tiled memory in accordance with the present invention is shown in FIG. 17. In step 502 the memory cells are designed. A plurality of the memory cells are then arranged to form a cell array in step 504. In step 506, the charge requirements for the cell array are then determined. A charge source to supply the charge requirements of the cell array is then designed in step 508. The charge source and the cell array are then integrated together to form a memory tile in step 510. In step 512, a plurality of memory tiles are then arranged to form a tile array. An interface for selectively coupling memory cells within the tile array to external logic is then designed in step 514. Step 514 is illustrated as a separate path in the flow diagram of FIG. 17, as step 514 may be performed in parallel with the other path for steps 502 to 512. In step 516, the interface is integrated with the tile array to form a tiled memory. Note, the tiled memory can then be used as a stand alone memory device or as a tiled memory which is embedded within an integrated circuit.

Thus it is apparent that there has been provided, in accordance with the present invention, an integrated circuit having a tiled memory array, wherein the tiled memory array includes a plurality of a memory tiles, and each of the memory tiles has its own charge source circuitry. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What we claim is:

1. A tiled memory adapted to be connected to first and second power supply potentials external to said tiled memory via respective first and second connectors, the memory comprising:
    a plurality of memory tiles, each memory tile comprising:
        a plurality of memory cells, each memory cell coupled to receive power via said first and second connectors; and
        a charge source coupled to receive power via said first and second connectors, the charge source sourcing charge at a third potential different from said first and second power supply potentials for use within said memory tile; and
    an interface for selectively coupling the memory tiles to external logic.

2. The memory of claim 1 wherein each charge source is comprised of a plurality of atomic charge pumps.

3. The memory of claim 2 wherein the atomic charge pumps operate simultaneously.

4. The memory of claim 3 wherein the number of atomic charge pumps operating simultaneously is selectable.

5. The memory of claim 4 wherein each memory tile further comprises a voltage level detector coupled to the charge source, the voltage level detector detecting incorrect operation of said charge source.

6. The memory of claim 5 wherein the voltage level detector, in response to detecting incorrect operation of said charge source, provides an output signal.

7. The memory of claim 6 wherein the voltage level detector, in response to detecting incorrect operation of said charge source, disables said charge source.

8. The memory of claim 7 wherein each memory tile further comprises fault logic coupled between the memory cells and the interface, the fault logic detecting a bit error.

9. The memory of claim 8 wherein the fault logic includes error correction logic.

10. The memory of claim 9 wherein the fault logic can detect double bit errors and correct single bit errors.

11. The memory of claim 10 wherein each memory tile further comprises an address decoder coupled to the interface and to each of the memory cells, the address decoder receiving an address from said external logic via said interface and selectively coupling one of said memory cells to said external logic via said interface.

12. The memory of claim 11 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

13. The memory of claim 12 wherein the memory cells are arranged in an array of rows and columns.

14. The memory of claim 13 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

15. The memory of claim 14 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

16. The memory of claim 13 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

17. The memory of claim 5 wherein the voltage level detector, in response to detecting incorrect operation of said charge source, disables said charge source.

18. The memory of claim 17 wherein each memory tile further comprises fault logic coupled between the memory cells and the interface, the fault logic detecting a bit error.

19. The memory of claim 18 wherein the fault logic includes error correction logic.

20. The memory of claim 19 wherein the fault logic can detect double bit errors and correct single bit errors.

21. The memory of claim 20 wherein each memory tile further comprises an address decoder coupled to the interface and to each of the memory cells, the address decoder receiving an address from said external logic via said interface and selectively coupling one of said memory cells to said external logic via said interface.

22. The memory of claim 21 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

23. The memory of claim 22 wherein the memory cells are arranged in an array of rows and columns.

24. The memory of claim 23 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

25. The memory of claim 24 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

26. The memory of claim 23 wherein each memory tile further comprises at least one redundant column of memory cells, and wherein the address decoder includes column redundancy control logic, the redundancy control logic enabling, in response, to a redundancy control signal, said redundant column to be addressed in place of a selected one of said columns.

27. The memory of claim 4 wherein each memory tile further comprises fault logic coupled between the memory cells and the interface, the fault logic detecting a bit error.

28. The memory of claim 27 wherein the fault logic includes error correction logic.

29. The memory of claim 28 wherein the fault logic can detect double bit errors and correct single bit errors.

30. The memory of claim 29 wherein each memory tile further comprises an address decoder coupled to the interface and to each of the memory cells, the address decoder receiving an address from said external logic via said interface and selectively coupling one of said memory cells to said external logic via said interface.

31. The memory of claim 30 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

32. The memory of claim 31 wherein the memory cells are arranged in an array of rows and columns.

33. The memory of claim 32 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

34. The memory of claim 33 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

35. The memory of claim 32 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

36. The memory of claim 4 wherein each memory tile further comprises an address decoder coupled to the interface and to each of the memory cells, the address decoder receiving an address from said external logic via said interface and selectively coupling one of said memory cells to said external logic via said interface.

37. The memory of claim 36 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

38. The memory of claim 37 wherein the memory cells are arranged in an array of rows and columns.

39. The memory of claim 38 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

40. The memory of claim 39 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

41. The memory of claim 38 wherein each memory tile further comprises at least one redundant column of memory cells, and wherein the address decoder includes column redundancy control logic, the redundancy control logic enabling, in responses to a redundancy control signal, said redundant column to be addressed in place of a selected one of said columns.

42. The memory of claim 1 wherein each memory tile further comprises a voltage level detector coupled to the charge source, the voltage level detector detecting incorrect operation of said charge source.

43. The memory of claim 42 wherein the voltage level detector, in response to detecting incorrect operation of said charge source, provides an output signal.

44. The memory of claim 43 wherein the voltage level detector, in response to detecting incorrect operation of said charge source, disables said charge source.

45. The memory of claim 44 wherein each memory tile further comprises fault logic coupled between the memory cells and the interface, the fault logic detecting a bit error.

46. The memory of claim 45 wherein the fault logic includes error correction logic.

47. The memory of claim 46 wherein the fault logic can detect double bit errors and correct single bit errors.

48. The memory of claim 47 wherein each memory tile further comprises an address decoder coupled to the interface and to each of the memory cells, the address decoder receiving an address from said external logic via said interface and selectively coupling one of said memory cells to said external logic via said interface.

49. The memory of claim 48 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

50. The memory of claim 49 wherein the memory cells are arranged in an array of rows and columns.

51. The memory of claim 50 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

52. The memory of claim 51 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

53. The memory of claim 50 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

54. The memory of claim 42 wherein the voltage level detector, in response to detecting incorrect operation of said charge source, disables said charge source.

55. The memory of claim 54 wherein each memory tile further comprises fault logic coupled between the memory cells and the interface, the fault logic detecting a bit error.

56. The memory of claim 55 wherein the fault logic includes error correction logic.

57. The memory of claim 56 wherein the fault logic can detect double bit errors and correct single bit errors.

58. The memory of claim 57 wherein each memory tile further comprises an address decoder coupled to the interface and to each of the memory cells, the address decoder receiving an address from said external logic via said interface and selectively coupling one of said memory cells to said external logic via said interface.

59. The memory of claim 58 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

60. The memory of claim 59 wherein the memory cells are arranged in an array of rows and columns.

61. The memory of claim 60 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

62. The memory of claim 61 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

63. The memory of claim 60 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

64. The memory of claim 1 wherein each memory tile further comprises fault logic coupled between the memory cells and the interface, the fault logic detecting a bit error.

65. The memory of claim 64 wherein the fault logic includes error correction logic.

66. The memory of claim 65 wherein the fault logic can detect double bit errors and correct single bit errors.

67. The memory of claim 66 wherein each memory tile further comprises an address decoder couples to the interface and to each of the memory cells, the address decoder receiving an address from said external logic via said interface and selectively coupling one of said memory cells to said external logic via said interface.

68. The memory of claim 67 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

69. The memory of claim 68 wherein the memory cells are arranged in an array of rows and columns.

70. The memory of claim 69 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

71. The memory of claim 70 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

72. The memory of claim 69 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

73. The memory of claim 1 wherein each memory tile further comprises an address decoder coupled to the interface and to each of the memory cells, the address decoder receiving an address from said external logic via said interface and selectively coupling one of said memory cells to said external logic via said interface.

74. The memory of claim 73 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

75. The memory of claim 74 wherein the memory cells are arranged in an array of rows and columns.

76. The memory of claim 75 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

77. The memory of claim 76 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

78. The memory of claim 75 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

79. The memory of claim 1 wherein the charge source is comprised of a plurality of atomic voltage regulators.

80. The memory of claim 79 wherein the atomic voltage regulators operate simultaneously.

81. The memory of claim 80 wherein the number of atomic voltage regulators operating simultaneously is selectable.

82. The memory of claim 81 wherein each memory tile further comprises a voltage level detector coupled to the charge source, the voltage level detector detecting incorrect operation of said charge source.

83. The memory of claim 82 wherein the voltage level detector, in response to detecting incorrect operation of said charge source, provides an output signal.

84. The memory of claim 83 wherein the voltage level detector, in response to detecting incorrect operation of said charge source, disables said charge source.

85. The memory of claim 84 wherein each memory tile further comprises fault logic coupled between the memory cells and the interface, the fault logic detecting a bit error.

86. The memory of claim 85 wherein the fault logic includes error correction logic.

87. The memory of claim 86 wherein the fault logic can detect double bit errors and correct single bit errors.

88. The memory of claim 87 wherein each memory tile further comprises an address decoder coupled to the interface and to each of the memory cells, the address decoder receiving an address from said external logic via said interface and selectively coupling one of said memory cells to said external logic via said interface.

89. The memory of claim 88 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

90. The memory of claim 89 wherein the memory cells are arranged in an array of rows and columns.

91. The memory of claim 90 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

92. The memory of claim 91 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

93. The memory of claim 90 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

94. The memory of claim 82 wherein the voltage level detector, in response to detecting incorrect operation of said charge source, disables said charge source.

95. The memory of claim 94 wherein each memory tile further comprises fault logic coupled between the memory cells and the interface, the fault logic detecting a bit error.

96. The memory of claim 95 wherein the fault logic includes error correction logic.

97. The memory of claim 96 wherein the fault logic can detect double bit errors and correct single bit errors.

98. The memory of claim 97 wherein each memory tile further comprises an address decoder coupled to the interface and to each of the memory cells, the address decoder receiving an address from said external logic via said interface and selectively coupling one of said memory cells to said external logic via said interface.

99. The memory of claim 98 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

100. The memory of claim 99 wherein the memory cells are arranged in an array of rows and columns.

101. The memory of claim 100 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

102. The memory of claim 101 wherein each memory tile further comprises at least one redundant column of memory cells, and wherein the address decoder includes redundancy control logic, the redundancy control logic enabling, in response to as column redundancy control signal, said redundant column to be addressed in place of a selected one of said columns.

103. The memory of claim 100 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

104. The memory of claim 81 wherein each memory tile further comprises fault logic coupled between the memory cells and the interface, the fault logic detecting a bit error.

105. The memory of claim 104 wherein the fault logic includes error correction logic.

106. The memory of claim 105 wherein the fault logic can detect double bit errors and correct single bit errors.

107. The memory of claim 106 wherein each memory tile further comprises an address decoder coupled to the interface and to each of the memory cells, the address decoder receiving an address from said external logic via said interface and selectively coupling one of said memory cells to said external logic via said interface.

108. The memory of claim 107 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

109. The memory of claim 108 wherein the memory cells are arranged in an array of rows and columns.

110. The memory of claim 109 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

111. The memory of claim 110 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

112. The memory of claim 109 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

113. The memory of claim 81 wherein each memory tile further comprises an address decoder coupled to the interface and to each of the memory cells, the address decoder receiving an address from said external logic via said interface and selectively coupling one of said memory cells to said external logic via said interface.

114. The memory of claim 113 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

115. The memory of claim 114 wherein the memory cells are arranged in an array of rows and columns.

116. The memory of claim 115 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

117. The memory of claim 116 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

118. The memory of claim 115 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

119. The memory of claim 1 wherein each memory tile further comprises access control logic.

120. The memory of claim 119 wherein the access control logic comprises address buffers and timing logic.

121. The memory of claim 1 wherein each memory tile further comprises data buffers coupled to the interface and to each of the memory cells.

122. The memory of claim 121 wherein each memory tile further comprises sense amplifiers coupled between each of the memory cells and a respective one of said data buffers.

123. An integrated circuit having a tiled memory adapted to be connected to first and second power supply potentials external to said tiled memory via respective first and second connectors, the memory comprising:
    a plurality of memory tiles, each memory tile comprising:
        a plurality of memory cells, each memory cell coupled to receive power via said first and second connectors; and
        a charge source coupled to receive power via said first and second connectors, the charge source sourcing charge at a third potential different from said first and second power supply potentials for use within said memory tile; and
    an interface for selectively coupling the memory tiles to external logic.

124. The integrated circuit of claim 123 wherein each charge source is comprised of a plurality of atomic charge pumps.

125. The integrated circuit of claim 124 wherein the atomic charge pumps operate simultaneously.

126. The integrated circuit of claim 125 wherein the number of atomic charge pumps operating simultaneously is selectable.

127. The integrated circuit of claim 126 wherein each memory tile further comprises a voltage level detector coupled to the charge source, the voltage level detector detecting incorrect operation of said charge source.

128. The integrated circuit of claim 127 wherein the voltage level detector, in response to detecting incorrect operation of said charge source, provides an output signal.

129. The integrated circuit of claim 128 wherein the voltage level detector, in response to detecting incorrect operation of said charge source, disables said charge source.

130. The integrated circuit of claim 129 wherein each memory tile further comprises fault logic coupled between the memory cells and the interface, the fault logic detecting a bit error.

131. The integrated circuit of claim 130 wherein the fault logic includes error correction logic.

132. The integrated circuit of claim 131 wherein the fault logic can detect double bit errors and correct single bit errors.

133. The integrated circuit of claim 132 wherein each memory tile further comprises an address decoder coupled to the interface and to each of the memory cells, the address decoder receiving an address from said external logic via said interface and selectively coupling one of said memory cells to said external logic via said interface.

134. The integrated circuit of claim 133 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

135. The integrated circuit of claim 134 wherein the memory cells are arranged in an array of rows and columns.

136. The integrated circuit of claim 135 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

137. The integrated circuit of claim 136 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

138. The integrated circuit of claim 135 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

139. The integrated circuit of claim 127 wherein the voltage level detector, in response to detecting incorrect operation of said charge source, disables said charge source.

140. The integrated circuit of claim 139 wherein each memory tile further comprises fault logic coupled between the memory cells and the interface, the fault logic detecting a bit error.

141. The integrated circuit of claim 140 wherein the fault logic includes error correction logic.

142. The integrated circuit of claim 141 wherein the fault logic can detect double bit errors and correct single bit errors.

143. The integrated circuit of claim 142 wherein each memory tile further comprises an address decoder coupled to the interface and to each of the memory cells, the address decoder receiving an address from said external logic via said interface and selectively coupling one of said memory cells to said external logic via said interface.

144. The integrated circuit of claim 143 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

145. The integrated circuit of claim 144 wherein the memory cells are arranged in an array of rows and columns.

146. The integrated circuit of claim 145 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

147. The integrated circuit of claim 146 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

148. The integrated circuit of claim 145 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

149. The integrated circuit of claim 126 wherein each memory tile further comprises fault logic coupled between the memory cells and the interface, the fault logic detecting a bit error.

150. The integrated circuit of claim 149 wherein the fault logic includes error correction logic.

151. The integrated circuit of claim 150 wherein the fault logic can detect double bit errors and correct single bit errors.

152. The integrated circuit of claim 151 wherein each memory tile further comprises an address decoder coupled to the interface and to each of the memory cells, the address decoder receiving an address from said external logic via said interface and selectively coupling one of said memory cells to said external logic via said interface.

153. The integrated circuit of claim 152 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

154. The integrated circuit of claim 153 wherein the memory cells are arranged in an array of rows and columns.

155. The integrated circuit of claim 154 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

156. The integrated circuit of claim 155 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

157. The integrated circuit of claim 154 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

158. The integrated circuit of claim 126 wherein each memory tile further comprises an address decoder coupled to the interface and to each of the memory cells, the address decoder receiving an address from said external logic via said interface and selectively coupling one of said memory cells to said external logic via said interface.

159. The integrated circuit of claim 158 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

160. The integrated circuit of claim 159 wherein the memory cells are arranged in an array of rows and columns.

161. The integrated circuit of claim 160 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

162. The integrated circuit of claim 161 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

163. The integrated circuit of claim 160 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

164. The integrated circuit of claim 123 wherein each memory tile further comprises a voltage level detector coupled to the charge source, the voltage level detector detecting incorrect operation of said charge source.

165. The integrated circuit of claim 164 wherein the voltage level detector, in response to detecting incorrect operation of said charge source, provides an output signal.

166. The integrated circuit of claim 165 wherein the voltage level detector, in response to detecting incorrect operation of said charge source, disables said charge source.

167. The integrated circuit of claim 166 wherein each memory tile further comprises fault logic coupled between the memory cells and the interface, the fault logic detecting a bit error.

168. The integrated circuit of claim 167 wherein the fault logic includes error correction logic.

169. The integrated circuit of claim 168 wherein the fault logic can detect double bit errors and correct single bit errors.

170. The integrated circuit of claim 169 wherein each memory tile further comprises an address decoder coupled to the interface and to each of the memory cells, the address decoder receiving an address from said external logic via said interface and selectively coupling one of said memory cells to said external logic via said interface.

171. The integrated circuit of claim 170 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

172. The integrated circuit of claim 171 wherein the memory cells are arranged in an array of rows and columns.

173. The integrated circuit of claim 172 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

174. The integrated circuit of claim 173 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

175. The integrated circuit of claim 172 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

176. The integrated circuit of claim 164 wherein the voltage level detector, in response to detecting incorrect operation of said charge source, disables said charge source.

177. The integrated circuit of claim 176 wherein each memory tile further comprises fault logic coupled between the memory cells and the interface, the fault logic detecting a bit error.

178. The integrated circuit of claim 177 wherein the fault logic includes error correction logic.

179. The integrated circuit of claim 178 wherein the fault logic can detect double bit errors and correct single bit errors.

180. The integrated circuit of claim 179 wherein each memory tile further comprises an address decoder coupled to the interface and to each of the memory cells, the address decoder receiving an address from said external logic via said interface and selectively coupling one of said memory cells to said external logic via said interface.

181. The integrated circuit of claim 180 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

182. The integrated circuit of claim 181 wherein the memory cells are arranged in an array of rows and columns.

183. The integrated circuit of claim 182 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

184. The integrated circuit of claim 183 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

185. The integrated circuit of claim 182 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

186. The integrated circuit of claim 123 wherein each memory tile further comprises fault logic coupled between the memory cells and the interface, the fault logic detecting a bit error.

187. The integrated circuit of claim 186 wherein the fault logic includes error correction logic.

188. The integrated circuit of claim 187 wherein the fault logic can detect double bit errors and correct single bit errors.

189. The integrated circuit of claim 188 wherein each memory tile further comprises an address decoder coupled to the interface and to each of the memory cells, the address decoder receiving an address from said external logic via said interface and selectively coupling one of said memory cells to said external logic via said interface.

190. The integrated circuit of claim 189 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

191. The integrated circuit of claim 190 wherein the memory cells are arranged in an array of rows and columns.

192. The integrated circuit of claim 191 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

193. The integrated circuit of claim 192 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

194. The integrated circuit of claim 191 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

195. The integrated circuit of claim 123 wherein each memory tile further comprises an address decoder coupled to the interface and to each of the memory cells, the address decoder receiving an address from said external logic via said interface and selectively coupling one of said memory cells to said external logic via said interface.

196. The integrated circuit of claim 195 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

197. The integrated circuit of claim 196 wherein the memory cells are arranged in an array of rows and columns.

198. The integrated circuit of claim 197 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

199. The integrated circuit of claim 198 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

200. The integrated circuit of claim 197 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

201. The integrated circuit of claim 123 wherein the charge source is comprised of a plurality of atomic voltage regulators.

202. The integrated circuit of claim 201 wherein the atomic voltage regulators operate simultaneously.

203. The integrated circuit of claim 202 wherein the number of atomic voltage regulators operating simultaneously is selectable.

204. The integrated circuit of claim 203 wherein each memory tile further comprises a voltage level detector coupled to the charge source, the voltage level detector detecting incorrect operation of said charge source.

205. The integrated circuit of claim 204 wherein the voltage level detector, in response to detecting incorrect operation of said charge source, provides an output signal.

206. The integrated circuit of claim 205 wherein the voltage level detector, in response to detecting incorrect operation of said charge source, disables said charge source.

207. The integrated circuit of claim 206 wherein each memory tile further comprises fault logic coupled between the memory cells and the interface, the fault logic detecting a bit error.

208. The integrated circuit of claim 207 wherein the fault logic includes error correction logic.

209. The integrated circuit of claim 208 wherein the fault logic can detect double bit errors and correct single bit errors.

210. The integrated circuit of claim 209 wherein each memory tile further comprises an address decoder coupled to the interface and to each of the memory cells, the address decoder receiving an address from said external logic via said interface and selectively coupling one of said memory cells to said external logic via said interface.

211. The integrated circuit of claim 210 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

212. The integrated circuit of claim 211 wherein the memory cells are arranged in an array of rows and columns.

213. The integrated circuit of claim 212 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

214. The integrated circuit of claim 213 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

215. The integrated circuit of claim 212 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

216. The integrated circuit of claim 204 wherein the voltage level detector, in response to detecting incorrect operation of said charge source, disables said charge source.

217. The integrated circuit of claim 216 wherein each memory tile further comprises fault logic coupled between the memory cells and the interface, the fault logic detecting a bit error.

218. The integrated circuit of claim 217 wherein the fault logic includes error correction logic.

219. The integrated circuit of claim 218 wherein the fault logic can detect double bit errors and correct single bit errors.

220. The integrated circuit of claim 219 wherein each memory tile further comprises an address decoder coupled to the interface and to each of the memory cells, the address decoder receiving an address from said external logic via said interface and selectively coupling one of said memory cells to said external logic via said interface.

221. The integrated circuit of claim 220 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

222. The integrated circuit of claim 221 wherein the memory cells are arranged in an array of rows and columns.

223. The integrated circuit of claim 222 wherein each memory tile further comprises at least one redundant row of memory cells, and wherein the address decoder includes

223. [continued] redundancy control logic, the redundancy control logic enabling, in response to a row redundancy control signal, said redundant row to be addressed in place of a selected one of said rows.

224. The integrated circuit of claim 223 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

225. The integrated circuit of claim 222 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

226. The integrated circuit of claim 203 wherein each memory tile further comprises fault logic coupled between the memory cells and the interface, the fault logic detecting a bit error.

227. The integrated circuit of claim 226 wherein the fault logic includes error correction logic.

228. The integrated circuit of claim 227 wherein the fault logic can detect double bit errors and correct single bit errors.

229. The integrated circuit of claim 228 wherein each memory tile further comprises an address decoder coupled to the interface and to each of the memory cells, the address decoder receiving an address from said external logic via said interface and selectively coupling one of said memory cells to said external logic via said interface.

230. The integrated circuit of claim 229 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

231. The integrated circuit of claim 230 wherein the memory cells are arranged in an array of rows and columns.

232. The integrated circuit of claim 231 wherein each memory tile further comprises at least one redundant row of memory cells, and wherein the address decoder includes redundancy control logic, the redundancy control logic enabling, in response to a row redundancy control signal, said redundant row to be addressed in place of a selected one of said rows.

233. The integrated circuit of claim 232 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

234. The integrated circuit of claim 231 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

235. The integrated circuit of claim 203 wherein each memory tile further comprises an address decoder coupled to the interface and to each of the memory cells, the address decoder receiving an address from said external logic via said interface and selectively coupling one of said memory cells to said external logic via said interface.

236. The integrated circuit of claim 235 wherein each memory tile further comprises at least one redundant memory cell, and wherein the address decoder includes redundancy control logic, the redundancy control logic enabling, in response to a redundancy control signal, said redundant memory cell to be addressed in place of a selected one of said memory cells.

237. The integrated circuit of claim 236 wherein the memory cells are arranged in an array of rows and columns.

238. The integrated circuit of claim 237 wherein each memory tile further comprises at least one redundant row of memory cells, and wherein the address decoder includes. redundancy control logic, the redundancy control logic enabling, in response to a row redundancy control signal, said redundant row to be addressed in place of a selected one of said rows.

239. The integrated circuit of claim 238 wherein each memory tile further comprises at least one redundant column of memory cells, and wherein the address decoder includes redundancy control logic, the redundancy control logic enabling, in response to a column redundancy control signal, said redundant column to be addressed in place of a selected one of said columns.

240. The integrated circuit of claim 237 wherein each memory tile further comprises at least one redundant column of memory cells, and wherein the address decoder includes column redundancy control logic, the redundancy control logic enabling, in response to a redundancy control signal, said redundant column to be addressed in place of a selected one of said columns.

241. The integrated circuit of claim 1 wherein each memory tile further comprises access control logic.

242. The integrated circuit of claim 119 wherein the access control logic comprises address buffers and timing logic.

243. The integrated circuit of claim 1 wherein each memory tile further comprises data buffers coupled to the interface and to each of the memory cells.

244. The integrated circuit of claim 121 wherein each memory tile further comprises sense amplifiers coupled between each of the memory cells and a respective one of said data buffers.

245. The integrated circuit of claim 1, wherein the charge source of an individual memory tile is adapted for coupling to at least one adjacent tile.

246. The integrated circuit of claim 245, wherein the individual memory tile is adapted for coupling to a charge source of the at least one adjacent tile.

247. The integrated circuit of claim 246, wherein the individual memory tile comprises a routing conductor, the routing conductor being prewired to couple the individual memory tile to the charge source of the at least one adjacent tile when the individual memory tile abuts the at least one adjacent tile.

* * * * *